United States Patent
Dunn et al.

(10) Patent No.: US 12,459,383 B2
(45) Date of Patent: *Nov. 4, 2025

(54) DISPLAY ASSEMBLIES INCORPORATING ELECTRIC VEHICLE CHARGING EQUIPMENT

(71) Applicant: Manufacturing Resources International, Inc., Alpharetta, GA (US)

(72) Inventors: William Dunn, Alpharetta, GA (US); Marcos Diaz, Alpharetta, GA (US); Alex Moreau, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/961,628

(22) Filed: Nov. 27, 2024

(65) Prior Publication Data
US 2025/0089180 A1    Mar. 13, 2025

Related U.S. Application Data

(63) Continuation of application No. 18/666,261, filed on May 16, 2024, now Pat. No. 12,200,877, which is a
(Continued)

(51) Int. Cl.
*H05K 5/00* (2025.01)
*B60L 53/302* (2019.01)
(Continued)

(52) U.S. Cl.
CPC ............. *B60L 53/302* (2019.02); *H05K 5/03* (2013.01); *H05K 7/20972* (2013.01)

(58) Field of Classification Search
CPC .... H05K 5/0017; H05K 5/03; H05K 7/20972; B60L 53/302; G06F 1/20; G06F 1/203
See application file for complete search history.

(56) References Cited

U.S. PATENT DOCUMENTS

| | | | |
|---|---|---|---|
| 3,757,218 A | 9/1973 | Oliverio et al. | |
| 4,093,355 A | 6/1978 | Kaplit et al. | |

(Continued)

FOREIGN PATENT DOCUMENTS

| | | | |
|---|---|---|---|
| AU | 2011248190 B2 | 5/2011 | |
| AU | 2014287438 B2 | 1/2018 | |

(Continued)

OTHER PUBLICATIONS

Itsenclosures, Product Catalog, 2009, 48 pages.
(Continued)

*Primary Examiner* — Stephen S Sul
(74) *Attorney, Agent, or Firm* — Standley Law Group LLP; Jeffrey S. Standley; Adam J. Smith

(57) ABSTRACT

Display assemblies with distributed airflow are provided. Side assemblies, each having a display layer located behind a cover are connected to a frame. A cavity is located, at least in part, between the side assemblies and spaced apart side panels of a frame. Open airflow pathways are fluidly connected to an ambient environment by way of an intake and extend, at least in part, along a rear portion of the electronic display subassembly of a respective one of the side assemblies to a respective one of exhausts. A closed airflow pathway includes the cavity and is fluidly separated from the ambient environment and the open airflow pathways, and extends, in part, within each of the side assemblies. A first set of fans is provided at or along the intake, and a second set of fans is provided at or along one of the side panels.

20 Claims, 22 Drawing Sheets

Related U.S. Application Data continuation of application No. 18/229,928, filed on Aug. 3, 2023, now Pat. No. 12,022,624, which is a continuation of application No. 17/508,896, filed on Oct. 22, 2021, now Pat. No. 11,778,757, which is a continuation-in-part of application No. 17/078,861, filed on Oct. 23, 2020, now Pat. No. 11,470,749.

(51) Int. Cl.
  *H05K 5/03* (2006.01)
  *H05K 7/20* (2006.01)

(56) References Cited

U.S. PATENT DOCUMENTS

| | | |
|---|---|---|
| 4,187,058 A | 2/1980 | Fish |
| 4,292,370 A | 9/1981 | Pekko |
| 4,327,803 A | 5/1982 | Muellejans et al. |
| 4,488,193 A | 12/1984 | Davis et al. |
| 4,593,978 A | 6/1986 | Mourey et al. |
| 4,634,225 A | 1/1987 | Haim et al. |
| 4,748,765 A | 6/1988 | Martin |
| 4,763,993 A | 8/1988 | Vogeley et al. |
| 4,792,881 A | 12/1988 | Wilson et al. |
| 4,903,221 A | 2/1990 | Krenz |
| 4,921,041 A | 5/1990 | Akachi |
| 4,952,783 A | 8/1990 | Aufderheide et al. |
| 4,952,925 A | 8/1990 | Haastert |
| 4,976,536 A | 12/1990 | Vogeley et al. |
| 5,002,118 A | 3/1991 | Olmstead et al. |
| 5,029,982 A | 7/1991 | Nash |
| 5,088,806 A | 2/1992 | McCartney et al. |
| 5,132,666 A | 7/1992 | Fahs |
| 5,150,231 A | 9/1992 | Iwamoto et al. |
| 5,247,374 A | 9/1993 | Terada |
| 5,255,029 A | 10/1993 | Vogeley et al. |
| 5,282,114 A | 1/1994 | Stone |
| 5,285,677 A | 2/1994 | Oehler |
| 5,293,930 A | 3/1994 | Pitasi |
| 5,351,176 A | 9/1994 | Smith et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,920,367 A | 7/1999 | Kajimoto et al. |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,204,906 B1 | 3/2001 | Tannas, Jr. |
| 6,211,934 B1 | 4/2001 | Habing et al. |
| 6,215,655 B1 | 4/2001 | Heady et al. |
| 6,244,333 B1 | 6/2001 | Bergh et al. |
| 6,351,381 B1 | 2/2002 | Bilski et al. |
| 6,359,390 B1 | 3/2002 | Nagai |
| 6,380,999 B1 | 4/2002 | Tannas, Jr. |
| 6,392,727 B1 | 5/2002 | Larson et al. |
| 6,405,463 B1 | 6/2002 | Roddy et al. |
| 6,417,900 B1 | 7/2002 | Shin et al. |
| 6,427,284 B1 | 8/2002 | Harrelson, II et al. |
| 6,428,198 B1 | 8/2002 | Saccomanno et al. |
| 6,437,673 B1 | 8/2002 | Nishida et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,496,236 B1 | 12/2002 | Cole et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,800,378 B2 | 10/2004 | Hawa et al. |
| 6,807,051 B2 | 10/2004 | Takahashi |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,164,586 B2 | 1/2007 | Lin |
| 7,170,759 B2 | 1/2007 | Soga |
| 7,190,416 B2 | 3/2007 | Paukshto et al. |
| 7,190,587 B2 | 3/2007 | Kim et al. |
| 7,209,349 B2 | 4/2007 | Chien et al. |
| 7,210,839 B2 | 5/2007 | Jung et al. |
| 7,212,403 B2 | 5/2007 | Rockenfell |
| 7,259,964 B2 | 8/2007 | Yamamura et al. |
| 7,269,023 B2 | 9/2007 | Nagano |
| 7,284,874 B2 | 10/2007 | Jeong et al. |
| 7,342,789 B2 | 3/2008 | Hall et al. |
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,458,767 B2 | 12/2008 | Wu et al. |
| 7,466,546 B2 | 12/2008 | Park |
| 7,480,140 B2 | 1/2009 | Hara et al. |
| 7,492,589 B2 | 2/2009 | Park |
| 7,518,864 B2 | 4/2009 | Kimura |
| 7,525,633 B2 | 4/2009 | Tannas, Jr. |
| 7,529,088 B2 | 5/2009 | Chiu et al. |
| 7,535,543 B2 | 5/2009 | Dewa et al. |
| 7,535,547 B2 | 5/2009 | Tannas, Jr. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,708,233 B2 | 5/2010 | Tannas, Jr. |
| 7,752,858 B2 | 7/2010 | Johnson et al. |
| 7,753,567 B2 | 7/2010 | Kang et al. |
| 7,762,707 B2 | 7/2010 | Kim et al. |
| 7,780,492 B2 | 8/2010 | Tannas, Jr. |
| 7,800,706 B2 | 9/2010 | Kim et al. |
| 7,813,124 B2 | 10/2010 | Karppanen |
| 7,864,258 B2 | 1/2011 | Cho et al. |
| 7,868,951 B2 | 1/2011 | Maruta et al. |
| 7,903,416 B2 | 3/2011 | Chou |
| 7,938,051 B2 | 5/2011 | Tannas |
| 7,995,342 B2 | 8/2011 | Nakamichi et al. |
| 8,004,648 B2 | 8/2011 | Dunn |

(56) References Cited

U.S. PATENT DOCUMENTS

| | | | |
|---|---|---|---|
| 8,035,968 B2 | 10/2011 | Kwon et al. |
| 8,081,267 B2 | 12/2011 | Moscovitch et al. |
| 8,081,465 B2 | 12/2011 | Nishiura |
| 8,102,173 B2 | 1/2012 | Merrow |
| 8,102,483 B2 | 1/2012 | Perry et al. |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,335,089 B2 | 12/2012 | Takahashi et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,462,497 B2 | 6/2013 | Li et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,061,597 B2 | 6/2015 | Oda et al. |
| 9,069,535 B2 * | 6/2015 | Degner | G02B 6/001 |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,335,579 B2 | 5/2016 | Onoue |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,504,188 B1 | 11/2016 | Campbell et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,600,026 B2 | 3/2017 | Birgeoglu et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,857,618 B2 | 1/2018 | Barnes |
| 9,861,007 B2 | 1/2018 | Yoon et al. |
| 9,894,800 B2 | 2/2018 | Dunn |
| 10,070,540 B2 | 9/2018 | Campagna et al. |
| 10,080,316 B2 | 9/2018 | Dunn et al. |
| 10,088,702 B2 | 10/2018 | Dunn et al. |
| 10,165,712 B1 | 12/2018 | Jang et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,278,312 B1 | 4/2019 | Davis et al. |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,066 B2 | 8/2019 | Dunn et al. |
| 10,405,456 B2 | 9/2019 | Jang et al. |
| 10,409,323 B2 | 9/2019 | Birgeoglu et al. |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,488,896 B2 | 11/2019 | Simpson |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,559,965 B2 | 2/2020 | Dunn et al. |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,747,261 B2 | 8/2020 | Birgeoglu et al. |
| 10,754,184 B2 | 8/2020 | Wang et al. |
| 10,757,844 B2 | 8/2020 | Dunn et al. |
| 10,795,413 B1 | 10/2020 | Dunn |
| 10,820,445 B2 | 10/2020 | Diaz |
| 10,827,656 B2 | 11/2020 | Hubbard |
| 10,827,657 B2 | 11/2020 | Lee |
| 10,905,035 B2 | 1/2021 | Whitehead et al. |
| 10,925,174 B2 | 2/2021 | Dunn et al. |
| 10,969,615 B2 | 4/2021 | Wang et al. |
| 10,973,156 B2 | 4/2021 | Dunn et al. |
| 10,983,382 B2 | 4/2021 | Takase |
| 11,013,142 B2 | 5/2021 | Dunn et al. |
| 11,016,547 B2 | 5/2021 | Whitehead et al. |
| 11,019,735 B2 | 5/2021 | Dunn |
| 11,032,923 B2 | 6/2021 | Dunn et al. |
| 11,096,317 B2 | 8/2021 | Dunn |
| 11,117,482 B2 * | 9/2021 | Mercer | G09F 19/02 |
| 11,132,715 B2 | 9/2021 | Menendez et al. |
| 11,148,621 B2 | 10/2021 | Dunn et al. |
| 11,191,193 B2 | 11/2021 | Hubbard |
| 11,206,750 B2 | 12/2021 | Lee et al. |
| 11,336,101 B2 | 5/2022 | Hao et al. |
| 11,470,749 B2 * | 10/2022 | Dunn | B60L 53/31 |

(56) References Cited

U.S. PATENT DOCUMENTS

| | | | |
|---|---|---|---|
| 11,477,923 B2 | 10/2022 | Brown | |
| 11,507,141 B2 | 11/2022 | Dunn | |
| 11,540,418 B2 | 12/2022 | Dunn et al. | |
| 11,596,081 B2 | 2/2023 | Dunn et al. | |
| 11,617,287 B2 | 3/2023 | Dunn | |
| 11,744,036 B2 | 8/2023 | Diaz | |
| 11,744,054 B2 | 8/2023 | Dunn et al. | |
| 11,762,231 B2 | 9/2023 | Dunn et al. | |
| 11,778,757 B2* | 10/2023 | Dunn | H05K 5/0017 |
| | | | 361/679.46 |
| 11,822,171 B2 | 11/2023 | Dunn et al. | |
| 11,889,636 B2 | 1/2024 | Dunn | |
| 11,919,393 B2 | 3/2024 | Dunn et al. | |
| 11,934,054 B2 | 3/2024 | Dunn et al. | |
| 11,966,263 B2 | 4/2024 | Dunn et al. | |
| 11,968,813 B2 | 4/2024 | Dunn et al. | |
| 11,989,059 B2 | 5/2024 | Dunn | |
| 12,004,310 B2* | 6/2024 | Dunn | H05K 5/03 |
| 12,004,311 B2 | 6/2024 | Dunn | |
| 12,010,813 B2 | 6/2024 | Dunn et al. | |
| 12,010,824 B2 | 6/2024 | Dunn | |
| 12,022,624 B2* | 6/2024 | Dunn | H05K 7/20972 |
| 12,035,486 B1 | 7/2024 | Dunn et al. | |
| 12,052,850 B2 | 7/2024 | Brown | |
| 2001/0001459 A1 | 5/2001 | Savant et al. | |
| 2001/0019454 A1 | 9/2001 | Tadic-Galeb et al. | |
| 2001/0023914 A1 | 9/2001 | Oddsen, Jr. | |
| 2001/0032404 A1 | 10/2001 | Hillstrom | |
| 2002/0009978 A1 | 1/2002 | Dukach et al. | |
| 2002/0033919 A1 | 3/2002 | Sanelle et al. | |
| 2002/0050793 A1 | 5/2002 | Cull et al. | |
| 2002/0065046 A1 | 5/2002 | Mankins et al. | |
| 2002/0084891 A1 | 7/2002 | Mankins et al. | |
| 2002/0101553 A1 | 8/2002 | Enomoto et al. | |
| 2002/0112026 A1 | 8/2002 | Fridman et al. | |
| 2002/0122134 A1 | 9/2002 | Kalua | |
| 2002/0126248 A1 | 9/2002 | Yoshida | |
| 2002/0135741 A1 | 9/2002 | Lee et al. | |
| 2002/0148600 A1 | 10/2002 | Bosch et al. | |
| 2002/0149714 A1 | 10/2002 | Anderson et al. | |
| 2002/0154255 A1 | 10/2002 | Gromatzky et al. | |
| 2002/0164944 A1 | 11/2002 | Haglid | |
| 2002/0164962 A1 | 11/2002 | Mankins et al. | |
| 2002/0167637 A1 | 11/2002 | Burke et al. | |
| 2003/0007109 A1 | 1/2003 | Park | |
| 2003/0020679 A1 | 1/2003 | Kojima et al. | |
| 2003/0020884 A1 | 1/2003 | Okada et al. | |
| 2003/0043091 A1 | 3/2003 | Takeuchi et al. | |
| 2003/0104210 A1 | 6/2003 | Azumi et al. | |
| 2003/0128511 A1 | 7/2003 | Nagashima et al. | |
| 2003/0214785 A1 | 11/2003 | Perazzo | |
| 2004/0012722 A1 | 1/2004 | Alvarez | |
| 2004/0025389 A1 | 2/2004 | Peterson | |
| 2004/0035032 A1 | 2/2004 | Milliken | |
| 2004/0035558 A1 | 2/2004 | Todd et al. | |
| 2004/0036622 A1 | 2/2004 | Dukach et al. | |
| 2004/0036834 A1 | 2/2004 | Ohnishi et al. | |
| 2004/0042174 A1 | 3/2004 | Tomioka et al. | |
| 2004/0103570 A1 | 6/2004 | Ruttenberg | |
| 2004/0105159 A1 | 6/2004 | Saccomanno et al. | |
| 2004/0135482 A1 | 7/2004 | Thielemans et al. | |
| 2004/0165139 A1 | 8/2004 | Anderson et al. | |
| 2004/0207981 A1 | 10/2004 | Gorenz, Jr. et al. | |
| 2004/0212548 A1 | 10/2004 | Ruttenberg | |
| 2004/0223299 A1 | 11/2004 | Ghosh | |
| 2005/0012039 A1 | 1/2005 | Faytlin et al. | |
| 2005/0012722 A1 | 1/2005 | Chon | |
| 2005/0062373 A1 | 3/2005 | Kim et al. | |
| 2005/0073632 A1 | 4/2005 | Dunn et al. | |
| 2005/0073639 A1 | 4/2005 | Pan | |
| 2005/0094039 A1 | 5/2005 | Kim et al. | |
| 2005/0127796 A1 | 6/2005 | Olesen et al. | |
| 2005/0134525 A1 | 6/2005 | Tanghe et al. | |
| 2005/0134526 A1 | 6/2005 | Willem et al. | |
| 2005/0213950 A1 | 9/2005 | Yoshimura | |
| 2005/0219841 A1 | 10/2005 | Ikeda et al. | |
| 2005/0229630 A1 | 10/2005 | Richter et al. | |
| 2005/0237714 A1 | 10/2005 | Ebermann | |
| 2005/0253699 A1 | 11/2005 | Madonia | |
| 2005/0276053 A1 | 12/2005 | Nortrup et al. | |
| 2005/0286131 A1 | 12/2005 | Saxena et al. | |
| 2006/0012958 A1 | 1/2006 | Tomioka et al. | |
| 2006/0012985 A1 | 1/2006 | Archie et al. | |
| 2006/0018093 A1 | 1/2006 | Lai et al. | |
| 2006/0034050 A1 | 2/2006 | Wang et al. | |
| 2006/0034051 A1 | 2/2006 | Wang et al. | |
| 2006/0056994 A1 | 3/2006 | Van Lear et al. | |
| 2006/0060732 A1 | 3/2006 | Tannas | |
| 2006/0077636 A1 | 4/2006 | Kim | |
| 2006/0081366 A1 | 4/2006 | Chiu et al. | |
| 2006/0081367 A1 | 4/2006 | Chiu et al. | |
| 2006/0082271 A1 | 4/2006 | Lee et al. | |
| 2006/0092348 A1 | 5/2006 | Park | |
| 2006/0125998 A1 | 6/2006 | Dewa et al. | |
| 2006/0132699 A1 | 6/2006 | Cho et al. | |
| 2006/0133090 A1 | 6/2006 | Noh et al. | |
| 2006/0144987 A1 | 7/2006 | Clark | |
| 2006/0177587 A1 | 8/2006 | Ishizuka et al. | |
| 2006/0198729 A1* | 9/2006 | Yamasaki | F04D 29/4213 |
| | | | 415/206 |
| 2006/0199514 A1 | 9/2006 | Kimura | |
| 2006/0209266 A1 | 9/2006 | Utsunomiya | |
| 2006/0221270 A1 | 10/2006 | Toki et al. | |
| 2006/0260790 A1 | 11/2006 | Theno et al. | |
| 2006/0262079 A1 | 11/2006 | Seong et al. | |
| 2006/0266499 A1 | 11/2006 | Choi et al. | |
| 2006/0266900 A1 | 11/2006 | May et al. | |
| 2006/0268194 A1 | 11/2006 | Morimoto et al. | |
| 2006/0269216 A1 | 11/2006 | Wiemeyer et al. | |
| 2006/0283579 A1 | 12/2006 | Ghosh et al. | |
| 2007/0013647 A1 | 1/2007 | Lee et al. | |
| 2007/0019419 A1 | 1/2007 | Hafuka et al. | |
| 2007/0021217 A1 | 1/2007 | Wu et al. | |
| 2007/0030879 A1 | 2/2007 | Hatta | |
| 2007/0046874 A1 | 3/2007 | Adachi et al. | |
| 2007/0047239 A1 | 3/2007 | Kang et al. | |
| 2007/0065091 A1 | 3/2007 | Hinata et al. | |
| 2007/0070615 A1 | 3/2007 | Joslin et al. | |
| 2007/0076431 A1 | 4/2007 | Atarashi et al. | |
| 2007/0081344 A1 | 4/2007 | Cappaert et al. | |
| 2007/0103863 A1 | 5/2007 | Kim | |
| 2007/0103866 A1 | 5/2007 | Park | |
| 2007/0115686 A1 | 5/2007 | Tyberghien | |
| 2007/0126335 A1 | 6/2007 | You et al. | |
| 2007/0139929 A1 | 6/2007 | Yoo et al. | |
| 2007/0140671 A1 | 6/2007 | Yoshimura | |
| 2007/0144704 A1 | 6/2007 | Bundza et al. | |
| 2007/0151164 A1 | 7/2007 | Marshall | |
| 2007/0151274 A1 | 7/2007 | Roche et al. | |
| 2007/0151664 A1 | 7/2007 | Shin | |
| 2007/0159035 A1 | 7/2007 | Mullen | |
| 2007/0171353 A1 | 7/2007 | Hong | |
| 2007/0176885 A1 | 8/2007 | Jun | |
| 2007/0206158 A1 | 9/2007 | Kinoshita et al. | |
| 2007/0211205 A1 | 9/2007 | Shibata | |
| 2007/0212211 A1 | 9/2007 | Chiyoda et al. | |
| 2007/0217221 A1 | 9/2007 | Lee et al. | |
| 2007/0237636 A1 | 10/2007 | Hsu | |
| 2007/0251680 A1* | 11/2007 | Kinoshita | F04D 29/681 |
| | | | 165/145 |
| 2007/0253205 A1 | 11/2007 | Welker | |
| 2007/0267174 A1 | 11/2007 | Kim | |
| 2007/0267554 A1 | 11/2007 | Tannas | |
| 2007/0274051 A1 | 11/2007 | Horng et al. | |
| 2008/0035315 A1 | 2/2008 | Han | |
| 2008/0054144 A1 | 3/2008 | Wohlford | |
| 2008/0055261 A1 | 3/2008 | Cernasov | |
| 2008/0055534 A1 | 3/2008 | Kawano | |
| 2008/0076342 A1 | 3/2008 | Bryant et al. | |
| 2008/0083527 A1 | 4/2008 | Horng et al. | |
| 2008/0099193 A1 | 5/2008 | Aksamit et al. | |
| 2008/0111936 A1 | 5/2008 | Kim | |
| 2008/0148609 A1 | 6/2008 | Ogoreve | |
| 2008/0165496 A1 | 7/2008 | Kang et al. | |

(56) References Cited

U.S. PATENT DOCUMENTS

| | | |
|---|---|---|
| 2008/0190210 A1 | 8/2008 | Harish et al. |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0021461 A1 | 1/2009 | Hu et al. |
| 2009/0034188 A1 | 2/2009 | Sween et al. |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0145581 A1 | 6/2009 | Hoffman et al. |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0227167 A1 | 9/2009 | Tannas, Jr. |
| 2009/0231807 A1 | 9/2009 | Bouissiere |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0142149 A1 | 6/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0213323 A1 | 8/2010 | Tannas, Jr. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0297907 A1 | 11/2010 | Tannas, Jr. |
| 2010/0315570 A1 | 12/2010 | Mathew et al. |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0051369 A1 | 3/2011 | Takahara |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0131936 A1 | 5/2012 | Yoshida et al. |
| 2012/0188481 A1 | 7/2012 | Kang et al. |
| 2012/0206687 A1 | 8/2012 | Dunn et al. |
| 2012/0223877 A1 | 9/2012 | Cho |
| 2012/0224116 A1 | 9/2012 | Barnes |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0069588 A1 | 3/2013 | Oda et al. |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1 | 10/2013 | Dunn |
| 2013/0294039 A1 | 11/2013 | Chao |
| 2013/0299651 A1 | 11/2013 | McGowan et al. |
| 2013/0300360 A1 | 11/2013 | Kobayashi et al. |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0268657 A1 | 9/2014 | Dunn et al. |
| 2014/0313452 A1 | 10/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1 | 1/2015 | Dunn et al. |
| 2015/0066837 A1 | 3/2015 | Twarog et al. |
| 2015/0069832 A1 | 3/2015 | Yamane et al. |
| 2015/0087404 A1 | 3/2015 | Lesley et al. |
| 2015/0173237 A1 | 6/2015 | Lin et al. |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2015/0371571 A1 | 12/2015 | Häger |
| 2016/0014910 A1 | 1/2016 | Campagna et al. |
| 2016/0041423 A1 | 2/2016 | Dunn |
| 2016/0044829 A1 | 2/2016 | Dunn |
| 2016/0121735 A1 | 5/2016 | Sugano |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0232822 A1 | 8/2016 | Ward et al. |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0053570 A1 | 2/2017 | Cox et al. |
| 2017/0068042 A1 | 3/2017 | Dunn et al. |
| 2017/0074453 A1 | 3/2017 | Bowers et al. |

(56) References Cited

U.S. PATENT DOCUMENTS

| | | |
|---|---|---|
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0172016 A1 | 6/2017 | Kang |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0318921 A1 | 11/2017 | Gharabegian |
| 2017/0332523 A1 | 11/2017 | DeMars |
| 2017/0345346 A1 | 11/2017 | Hong et al. |
| 2018/0020579 A1 | 1/2018 | Chang et al. |
| 2018/0042134 A1 | 2/2018 | Dunn et al. |
| 2018/0088368 A1 | 3/2018 | Notoshi et al. |
| 2018/0088398 A1 | 3/2018 | Lee et al. |
| 2018/0111495 A1 | 4/2018 | Kinomura |
| 2018/0116073 A1 | 4/2018 | Dunn |
| 2018/0199450 A1 | 7/2018 | Kim et al. |
| 2018/0259806 A1 | 9/2018 | Oh et al. |
| 2018/0263142 A1 | 9/2018 | Oh et al. |
| 2018/0310439 A1 | 10/2018 | Oh et al. |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0345809 A1 | 12/2018 | Derrien et al. |
| 2018/0364519 A1 | 12/2018 | Dunn et al. |
| 2019/0021189 A1 | 1/2019 | Kim et al. |
| 2019/0037738 A1 | 1/2019 | Dunn et al. |
| 2019/0056058 A1 | 2/2019 | Pell et al. |
| 2019/0089176 A1 | 3/2019 | Dunn et al. |
| 2019/0133002 A1 | 5/2019 | Dunn et al. |
| 2019/0147492 A1 | 5/2019 | Krylov |
| 2019/0159363 A1 | 5/2019 | Jang et al. |
| 2019/0208674 A1 | 7/2019 | Demars |
| 2019/0239365 A1 | 8/2019 | Dunn et al. |
| 2019/0289754 A1 | 9/2019 | Hubbard |
| 2019/0302854 A1 | 10/2019 | Wu et al. |
| 2019/0327865 A1 | 10/2019 | Dunn et al. |
| 2020/0033017 A1 | 1/2020 | Brown et al. |
| 2020/0096797 A1 | 3/2020 | Teragawa |
| 2020/0124104 A1* | 4/2020 | Dickinson ............ F16C 27/066 |
| 2020/0154597 A1 | 5/2020 | Dunn et al. |
| 2020/0163235 A1 | 5/2020 | Dunn |
| 2020/0187391 A1* | 6/2020 | Zhu ................... H05K 7/20909 |
| 2020/0201402 A1 | 6/2020 | Lee et al. |
| 2020/0205303 A1 | 6/2020 | Dunn et al. |
| 2020/0241612 A1 | 7/2020 | Moon et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0319676 A1 | 10/2020 | Dunn |
| 2020/0352049 A1 | 11/2020 | Dunn et al. |
| 2020/0366104 A1 | 11/2020 | Stanfield |
| 2020/0367391 A1 | 11/2020 | Dunn |
| 2020/0369169 A1 | 11/2020 | Mercer et al. |
| 2020/0387194 A1 | 12/2020 | Dunn |
| 2020/0390004 A1 | 12/2020 | Whitehead et al. |
| 2020/0390009 A1 | 12/2020 | Whitehead et al. |
| 2021/0007241 A1 | 1/2021 | Diaz |
| 2021/0022273 A1 | 1/2021 | Hubbard |
| 2021/0094437 A1 | 4/2021 | Tsubokura et al. |
| 2021/0165472 A1 | 6/2021 | Chin |
| 2021/0168949 A1 | 6/2021 | Dunn et al. |
| 2021/0182919 A1 | 6/2021 | Wyckoff et al. |
| 2021/0231998 A1 | 7/2021 | Noso et al. |
| 2021/0243906 A1 | 8/2021 | Dunn |
| 2021/0243914 A1 | 8/2021 | Dunn |
| 2021/0304644 A1 | 9/2021 | Webster |
| 2021/0307214 A1 | 9/2021 | Zhang et al. |
| 2021/0345528 A1 | 11/2021 | Dunn |
| 2021/0397010 A1 | 12/2021 | Mou et al. |
| 2021/0400853 A1 | 12/2021 | Choi |
| 2021/0408676 A1 | 12/2021 | Sainz Fuertes |
| 2022/0035198 A1 | 2/2022 | Dunn et al. |
| 2022/0073021 A1 | 3/2022 | Dunn et al. |
| 2022/0110227 A1 | 4/2022 | Brown |
| 2022/0121255 A1 | 4/2022 | Wang et al. |
| 2022/0132681 A1 | 4/2022 | Dunn et al. |
| 2022/0132699 A1 | 4/2022 | Sakano et al. |
| 2022/0132707 A1 | 4/2022 | Dunn et al. |
| 2022/0252927 A1 | 8/2022 | Wang et al. |
| 2022/0287200 A1 | 9/2022 | Dunn et al. |
| 2022/0394861 A1 | 12/2022 | Dunn et al. |
| 2022/0408616 A1 | 12/2022 | Brown |
| 2022/0408617 A1 | 12/2022 | Brown |
| 2023/0030742 A1 | 2/2023 | Dunn et al. |
| 2023/0032626 A1 | 2/2023 | Brown |
| 2023/0033017 A1 | 2/2023 | Dunn |
| 2023/0036767 A1 | 2/2023 | Dunn et al. |
| 2023/0056061 A1 | 2/2023 | Dunn et al. |
| 2023/0058547 A1 | 2/2023 | Dunn et al. |
| 2023/0059819 A1 | 2/2023 | Dunn et al. |
| 2023/0160774 A1 | 5/2023 | Dunn et al. |
| 2023/0164964 A1 | 5/2023 | Dunn et al. |
| 2023/0200031 A1 | 6/2023 | Dunn |
| 2023/0209786 A1 | 6/2023 | Dunn |
| 2023/0287670 A1 | 9/2023 | Ethier |
| 2023/0345683 A1 | 10/2023 | Dunn et al. |
| 2023/0359077 A1 | 11/2023 | Dunn et al. |
| 2023/0380079 A1 | 11/2023 | Dunn et al. |
| 2023/0422431 A1 | 12/2023 | Dunn et al. |
| 2023/0422453 A1 | 12/2023 | Dunn |
| 2024/0032238 A1 | 1/2024 | Dunn et al. |
| 2024/0114633 A1 | 4/2024 | Dunn |
| 2024/0219980 A1 | 7/2024 | Dunn et al. |
| 2024/0264633 A1 | 8/2024 | Dunn |
| 2024/0268088 A1 | 8/2024 | Dunn et al. |
| 2024/0292561 A1 | 8/2024 | Dunn et al. |
| 2024/0292562 A1 | 8/2024 | Dunn et al. |
| 2024/0292563 A1 | 8/2024 | Dunn et al. |
| 2024/0292580 A1 | 8/2024 | Dunn |
| 2024/0306314 A1 | 9/2024 | Dunn et al. |

FOREIGN PATENT DOCUMENTS

| | | |
|---|---|---|
| AU | 2015253128 B2 | 3/2018 |
| AU | 2017216500 B2 | 1/2019 |
| AU | 2015229457 B2 | 3/2019 |
| AU | 2016220308 B2 | 3/2019 |
| AU | 2017228430 B2 | 3/2020 |
| AU | 2018258497 B2 | 1/2021 |
| AU | 2018257648 B2 | 2/2021 |
| BR | PI0820231-1 | 2/2019 |
| CA | 2705814 C | 2/2018 |
| CA | 2947524 C | 4/2018 |
| CA | 2915261 C | 8/2018 |
| CA | 2798277 C | 6/2019 |
| CA | 2809019 C | 9/2019 |
| CA | 2888494 C | 9/2019 |
| CA | 2976116 C | 11/2020 |
| CA | 3015365 C | 8/2021 |
| CA | 3059972 C | 1/2022 |
| CA | 2942321 C | 6/2022 |
| CA | 3059928 C | 11/2022 |
| CN | 2702363 Y | 5/2005 |
| CN | 201228893 Y | 4/2009 |
| CN | 202838830 U | 3/2013 |
| CN | 104640422 A | 5/2015 |
| CN | 205788911 U | 12/2016 |
| CN | 106304788 A | 1/2017 |
| CN | 107251671 A | 10/2017 |
| CN | 108700739 A | 10/2018 |
| CN | 107251671 B | 8/2019 |
| CN | 216697703 U | 6/2022 |
| EP | 1408476 A1 | 4/2004 |
| EP | 1647766 A2 | 4/2006 |

(56) References Cited

FOREIGN PATENT DOCUMENTS

| | | |
|---|---|---|
| EP | 1722559 A1 | 11/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2587175 A1 | 5/2013 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3040766 A1 | 7/2016 |
| EP | 3117693 A2 | 1/2017 |
| EP | 3259968 A1 | 12/2017 |
| EP | 3423886 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| EP | 3624574 A1 | 3/2020 |
| EP | 3468321 B1 | 4/2021 |
| EP | 3423886 B1 | 2/2022 |
| EP | 3259968 B1 | 4/2022 |
| EP | 4232870 A1 | 8/2023 |
| EP | 3615978 B1 | 1/2024 |
| EP | 3616481 B1 | 7/2024 |
| FR | 2893752 A1 | 5/2007 |
| GB | 2402205 A | 12/2004 |
| JP | 402062015 A | 3/1990 |
| JP | 402307080 A | 12/1990 |
| JP | 3153212 A | 7/1991 |
| JP | H497194 A | 3/1992 |
| JP | H06-2337 U | 1/1994 |
| JP | 6082745 A | 3/1994 |
| JP | H8-54834 A | 2/1996 |
| JP | H8-55567 A | 2/1996 |
| JP | 8115788 A | 5/1996 |
| JP | H8-152604 A | 6/1996 |
| JP | 8194437 A | 7/1996 |
| JP | H08-305301 A | 11/1996 |
| JP | 8339034 A | 12/1996 |
| JP | H9-160512 A | 6/1997 |
| JP | H09246766 A | 9/1997 |
| JP | H10152604 A | 6/1998 |
| JP | H-10222076 A | 8/1998 |
| JP | H11-68363 A | 3/1999 |
| JP | 11160727 A | 6/1999 |
| JP | H-11233967 A | 8/1999 |
| JP | H11296094 A | 10/1999 |
| JP | 2000-10501 A | 1/2000 |
| JP | 2000112033 A | 4/2000 |
| JP | 2000131682 A | 5/2000 |
| JP | 3118907 B2 | 10/2000 |
| JP | 2001209125 A | 8/2001 |
| JP | 2001209126 A | 8/2001 |
| JP | 2001-249402 A | 9/2001 |
| JP | 2001326488 A | 11/2001 |
| JP | 2002-6282 A | 1/2002 |
| JP | 2002006757 A | 1/2002 |
| JP | 2002148714 A | 5/2002 |
| JP | 2002158475 A | 5/2002 |
| JP | 2003036032 A | 2/2003 |
| JP | 2003-76286 A | 3/2003 |
| JP | 2003-162228 A | 6/2003 |
| JP | 2003173147 A | 6/2003 |
| JP | 2004053749 A | 2/2004 |
| JP | 2004-199675 A | 7/2004 |
| JP | 2004193002 A | 7/2004 |
| JP | 2004285940 A | 10/2004 |
| JP | 2004286940 A | 10/2004 |
| JP | 2005017434 A | 1/2005 |
| JP | 2005017556 A | 1/2005 |
| JP | 2005134849 A | 5/2005 |
| JP | 2005181799 A | 7/2005 |
| JP | 2005265922 A | 9/2005 |
| JP | 2005292939 A | 10/2005 |
| JP | 2005332253 A | 12/2005 |
| JP | 2006010851 A | 1/2006 |
| JP | 2006-32890 A | 2/2006 |
| JP | 2006513577 A | 4/2006 |
| JP | 2006148047 A | 6/2006 |
| JP | 2006163217 A | 6/2006 |
| JP | 2006-176112 A | 7/2006 |
| JP | 2006198344 A | 8/2006 |
| JP | 2006293062 A | 10/2006 |
| JP | 2006317494 A | 11/2006 |
| JP | 2006-330196 A | 12/2006 |
| JP | 2007003638 A | 1/2007 |
| JP | 2007052951 A | 3/2007 |
| JP | 2007207595 A | 8/2007 |
| JP | 2007-293105 A | 11/2007 |
| JP | 09307257 A | 11/2007 |
| JP | 2007322718 A | 12/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-118130 A | 6/2012 |
| JP | 2012-133254 A | 7/2012 |
| JP | 2013-537721 A | 10/2013 |
| JP | 2014-225595 A | 12/2014 |
| JP | 6039450 B2 | 12/2016 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| JP | 6824440 B2 | 1/2021 |
| JP | 6858276 B2 | 3/2021 |
| KR | 20000000118 U | 1/2000 |
| KR | 200163508 Y1 | 7/2000 |
| KR | 20000047899 A | 7/2000 |
| KR | 200206768 Y1 | 12/2000 |
| KR | 20010044073 A | 6/2001 |
| KR | 200236278 Y1 | 10/2001 |
| KR | 10-2067751 B1 | 1/2002 |
| KR | 200286961 Y1 | 8/2002 |
| KR | 100673470 B1 | 1/2004 |
| KR | 1020040067701 A | 7/2004 |
| KR | 200366674 Y1 | 11/2004 |
| KR | 20050033986 A | 4/2005 |
| KR | 20050036254 A | 4/2005 |
| KR | 200401354 Y1 | 11/2005 |
| KR | 20060016469 A | 2/2006 |
| KR | 10-0563049 B1 | 3/2006 |
| KR | 20060054742 A | 5/2006 |
| KR | 10-2006-0070176 A | 6/2006 |
| KR | 20060091898 A | 8/2006 |
| KR | 20060120904 A | 11/2006 |
| KR | 100659339 B1 | 12/2006 |
| KR | 100666961 B1 | 1/2007 |
| KR | 20070002494 A | 1/2007 |
| KR | 1020070070675 A | 4/2007 |
| KR | 10-2007-0048300 A | 5/2007 |
| KR | 20070048296 A | 5/2007 |
| KR | 1020070048294 | 8/2007 |
| KR | 20080005024 A | 1/2008 |
| KR | 20080010091 A | 1/2008 |
| KR | 20080018486 A | 2/2008 |
| KR | 20080047241 A | 5/2008 |
| KR | 20090116368 A | 11/2009 |
| KR | 10-1153923 B1 | 6/2012 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |

(56) References Cited

FOREIGN PATENT DOCUMENTS

| | | |
|---|---|---|
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| KR | 10-2165778 B1 | 10/2020 |
| KR | 10-2262912 B1 | 6/2021 |
| KR | 10-2267374 B1 | 6/2021 |
| KR | 10-2306650 B1 | 9/2021 |
| KR | 10-2379046 B1 | 3/2022 |
| KR | 10-2400990 B1 | 5/2022 |
| KR | 10-2501211 B1 | 2/2023 |
| RU | 2513043 C2 | 4/2014 |
| WO | WO2005079129 A1 | 8/2005 |
| WO | WO2007/116117 A1 | 10/2007 |
| WO | WO2007116116 A1 | 10/2007 |
| WO | WO2008050660 A2 | 5/2008 |
| WO | WO2008085138 A | 7/2008 |
| WO | WO2008/102050 A1 | 8/2008 |
| WO | WO2009/047390 A1 | 4/2009 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A2 | 11/2011 |
| WO | WO2011150078 A2 | 12/2011 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014122943 A1 | 8/2014 |
| WO | WO2014149773 A1 | 9/2014 |
| WO | WO2014150036 A1 | 9/2014 |
| WO | 2014/195560 A1 | 12/2014 |
| WO | WO2015/138609 A2 | 9/2015 |
| WO | WO2015168375 A1 | 11/2015 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |
| WO | WO2020/081687 A1 | 4/2020 |
| WO | WO2020/205305 A1 | 10/2020 |
| WO | WO2022/087488 A1 | 4/2022 |
| WO | WO2023/096738 A1 | 6/2023 |
| WO | WO2024/020185 A1 | 1/2024 |

OTHER PUBLICATIONS

Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., Emc analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017, 14 pages.
Adnation, Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A—Appendix D, Jan. 24, 2018, 51 pages.
Civiq, Invalidity Contentions, Jan. 24, 2018, 51 pages.
Scott, Cooling of Electronic Equipment, Apr. 4, 1974, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC V. Manufacturing Resources International, Inc.*, Memorandum Opinion re claim construction, Sep. 27, 2018, 16 pages.
*Civiq Smartscapes, LLC V. Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.
Mentley, David E., State of Flat-Panel Display Technology and Future Trends, Proceedings of the IEEE, Apr. 2002, vol. 90, No. 4, pp. 453-459.
Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC. V Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC. V Manufacturing Resources International, Inc.*, Defendant's Amended Answer and Counterclaims to Plaintiff's First Amended Complaint, Filed Apr. 24, 2018, 240 pages.
*Civiq Smartscapes, LLC V. Manufacturing Resources International, Inc.*, Memorandum Order re "rear surface of the electronic display" term construction, Mar. 5, 2019, 3 pages.
United States International Trade Commission, *Manufacturing Resources International, Inc. v Samsung Electronics Co., Ltd et al.*, In the Matter of Certain Outdoor and Semioutdoor Electronic Displays, Products Containing Same, and Components Thereof, Inv. No. 337-TA-1331, Final Initial Determination of Violation of Section 337, Public Version, Nov. 13, 2023, 325 pages.
Declaration of Robert Smith Gillespie, Certain Outdoor and Semioutdoor Electronic Displays, Products, Containing same, and Components thereof, Jan. 17, 2023, 42 pages.
*Samsung Electronics Co., Ltd. and Samsung Electronics America, Inc. v Manufacturing Resources International, Inc.*, Declaration of Michael Gershowitz, Sep. 26, 2023, 77 pages.
*Samsung Electronics Co., Ltd. and Samsung Electronics America, Inc. v Manufacturing Resources International, Inc.*, Expert Declaration of Dr. Himanshu Pokhama,, Sep. 26, 2023, 104 pages.
*Samsung Electronics Co., Ltd. and Samsung Electronics America, Inc. v Manufacturing Resources International, Inc.*, Decision to Institute IPR2023-00199, Jun. 20, 2023, 53 pages.
*Samsung Electronics Co., Ltd. and Samsung Electronics America, Inc. v Manufacturing Resources International, Inc.*, Decision to Institute IPR2023-00220, Jun. 20, 2023, 51 pages.
*Samsung Electronics Co., Ltd. and Samsung Electronics America, Inc. v Manufacturing Resources International, Inc.*, Decision to Institute IPR2023-00221, Jun. 20, 2023, 80 pages.

(56) References Cited

OTHER PUBLICATIONS

*Samsung Electronics Co., Ltd. and Samsung Electronics America, Inc. v Manufacturing Resources International, Inc.,* Decision to Institute IPR2023-00254, Jun. 20, 2023, 72 pages.
*Samsung Electronics Co., Ltd. and Samsung Electronics America, Inc. v Manufacturing Resources International, Inc.,* Decision to Institute IPR2023-00255, Jul. 18, 2023, 47 pages.
*Samsung Electronics Co., Ltd. and Samsung Electronics America, Inc. v Manufacturing Resources International, Inc.,* Final Written Decision IPR2023-00199, Jul. 3, 2024, 78 pages.
*Samsung Electronics Co., Ltd. and Samsung Electronics America, Inc. v Manufacturing Resources International, Inc.,* Final Written Decision IPR2023-00220, Jul. 3, 2024, 78 pages.
*Samsung Electronics Co., Ltd. and Samsung Electronics America, Inc. v Manufacturing Resources International, Inc.,* Final Written Decision IPR2023-00254, Jul. 3, 2024, 114 pages.
*Samsung Electronics Co., Ltd. and Samsung Electronics America, Inc. v Manufacturing Resources International, Inc.,* Final Written Decision IPR2023-00221, Jul. 3, 2024, 116 pages.
*Samsung Electronics Co., Ltd. and Samsung Electronics America, Inc. v Manufacturing Resources International, Inc.,* Final Written Decision IPR2023-00255, Jul. 30, 2024, 94 pages.
Ito Masanobu; Kinoshita Hirokazu; Yamamoto Susumu; Ogura Yosuke; Kawata Yukio, "Home-Use Power Command Device and Home-Use Power Control System", 08-14-204, Mitsubishi Electric Corp; Mitsubishi Electric Home Appl., Entire Document (Translation of WO 2014122943) (Year: 2014).

\* cited by examiner

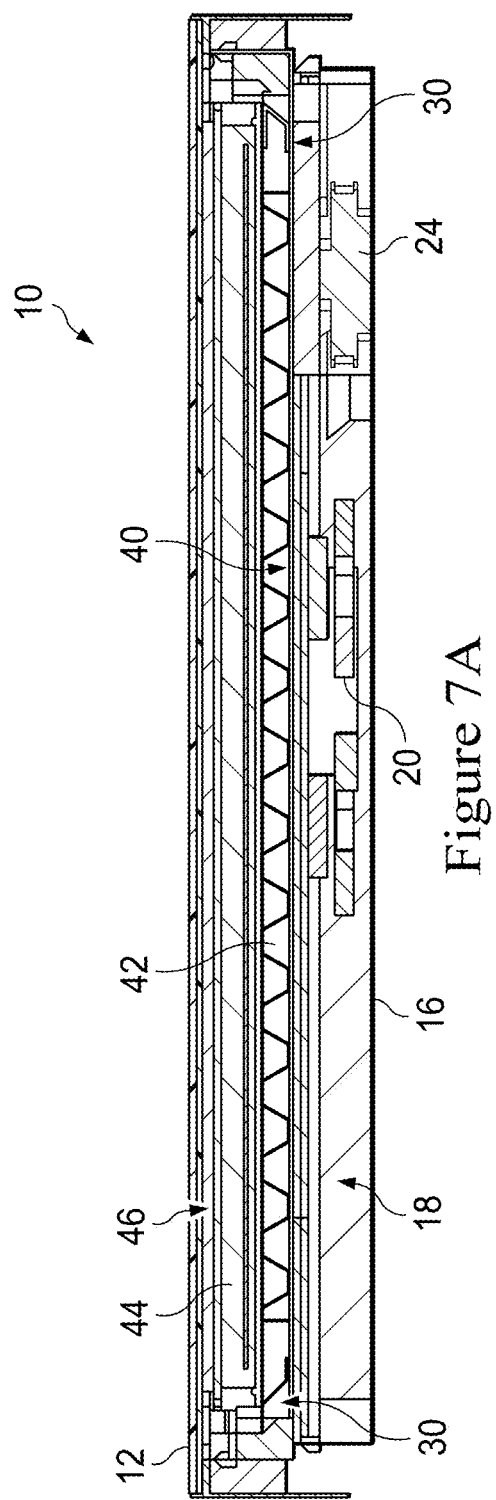

DISPLAY ASSEMBLIES INCORPORATING ELECTRIC VEHICLE CHARGING EQUIPMENT

CROSS-REFERENCE TO RELATED APPLICATIONS

This application is a continuation of U.S. application Ser. No. 18/666,261 filed May 16, 2024, which is a continuation of U.S. application Ser. No. 18/229,928 filed Aug. 3, 2023, now U.S. Pat. No. 12,022,624 issued Jun. 25, 2024, which is a continuation of U.S. application Ser. No. 17/508,896 filed Oct. 22, 2021, now U.S. Pat. No. 11,778,757 issued Oct. 3, 2023, which is a continuation-in-part of U.S. application Ser. No. 17/078,861 filed Oct. 23, 2020, now U.S. Pat. No. 11,470,749 issued Oct. 11, 2022, the disclosures of which are hereby incorporated by reference as if fully restated herein.

TECHNICAL FIELD

Exemplary embodiments relate generally to display assemblies incorporating electric vehicle chargers, such as with force air cooling.

BACKGROUND AND SUMMARY OF THE INVENTION

The use of electronic displays for advertising in the out-of-home market has increased in popularity over recent years. Being located outdoors, such electronic displays are frequently exposed to harsh conditions, including but not limited to, solar loading, extreme temperatures, precipitation, moisture, contaminants, vandalism, wildlife, and the like. To protect the electronic displays and other components from such harsh conditions, it is known to place the electronic displays in fully or partially sealed housings. The harsh conditions and/or placement in such fully or partially sealed housings, may create a need to thermally manage the electronic displays. It is known to provide open and/or closed loop airflow pathways through such housings to control temperatures, thereby maintaining desirable operating conditions for the electronic displays and related components. It is known to provide back-to-back electronic displays with a common plenum, such as is provided in U.S. Pat. No. 8,373,841 issued Feb. 12, 2013, or a common heat exchanger, such as is provided in U.S. Pat. No. 8,351,014 issued Jan. 8, 2013.

Traditionally, tube axial fans are used to force such cooling through these open and/or closed loop airflow pathways, though other types of fans such as centrifugal fans have been used. What is needed is an electronic display assembly which utilizes centrifugal fans to provide forced air cooling.

Electronic display assemblies which utilize centrifugal fans to provide forced air cooling are provided. Such centrifugal fans may be utilized in one or more open loop airflow pathways, one or more closed loop airflow pathways, some combination thereof, or the like.

The use of such centrifugal fans may provide several advantages. For example, without limitation, the design of such centrifugal fans may require that air be turned essentially 90 degrees during normal operation. Corners may be provided along the open and/or closed loop airflow pathways of display assemblies which normally provide areas of airflow resistance and/or turbulence. When deployed in such display assemblies, the centrifugal fan may be placed to essentially turn the air the 90 degrees otherwise required to complete a loop or pass through the housing. The use and engineered placement of centrifugal fans may therefore form a natural part of the open or closed loop airflow pathways and may improve airflow efficiency around such corners.

Additionally, or alternatively, such centrifugal fans may facilitate even distribution of air upon discharge. This may improve evenness of cooling, distribution, and/or airflow. For example, without limitation, the centrifugal fans may be provided without certain common shrouding components to facilitate such distribution.

As another example, without limitation, the centrifugal fans may reduce noise emission and/or utilize less power relative to other types of fans such as tube axial fans. As yet another example, without limitation, the centrifugal fans may provide the same or higher mass airflow rates for air. The use of such centrifugal fans may, for example, without limitation, result in increased homogenization of air. Such homogenization may lead to move even cooling and better temperature control of such display assemblies and related components. This may result in a reduction of the number of fans and/or the operating speed of such fans.

It may be desirable to incorporate electric vehicle ("EV") chargers into such display assemblies. Such EV chargers may be able to take advantage of established structural framework, power supplies, and/or thermal management capabilities of the display assemblies. Alternatively, or additionally, such display assemblies may be modified, such as structurally, electrically, or thermodynamically, to accommodate such EV chargers. In exemplary embodiments, advertisements, announcements, or entertaining images, to provide a few non-limiting examples, may be displayed at the subassemblies while electric vehicles are charged nearby.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 7A is a top sectional view of the display assembly of FIG. 1 taken along section line B-B of FIG. 2;

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
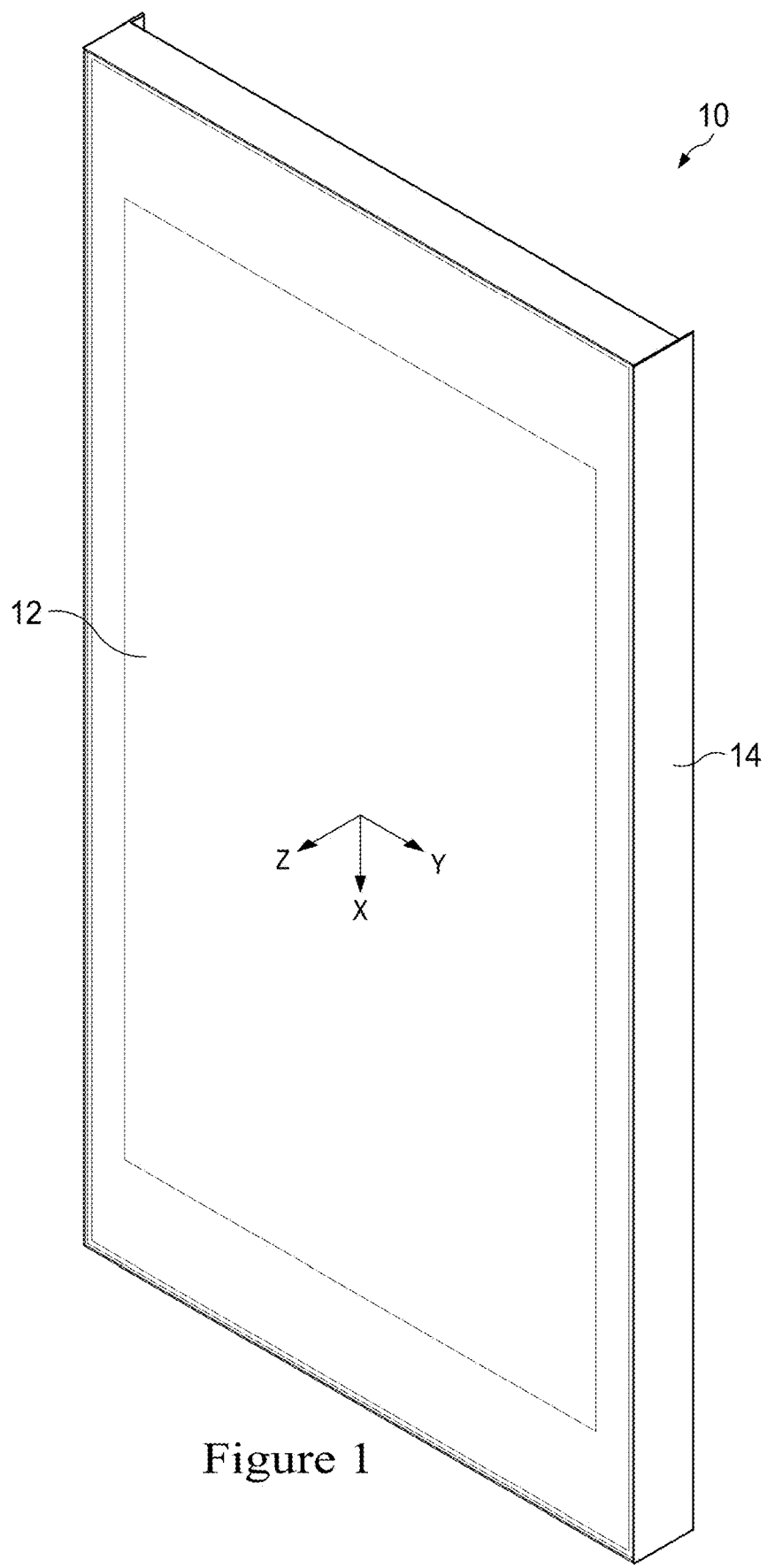
FIG. 1 is a front perspective view of an exemplary display assembly in accordance with the present invention.
Figure 2:
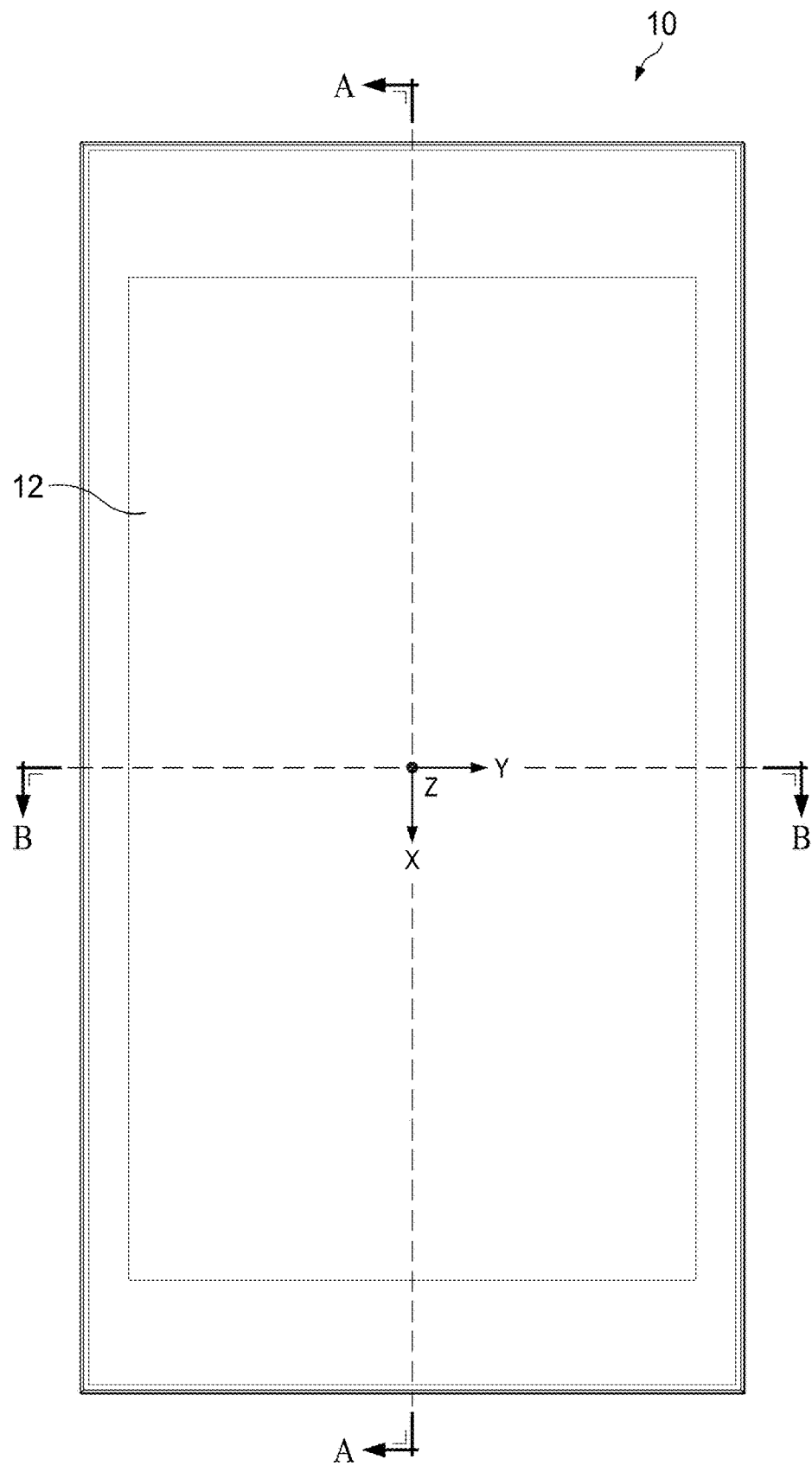
FIG. 2 is a front view of the display assembly of FIG. 1.
Figure 3:
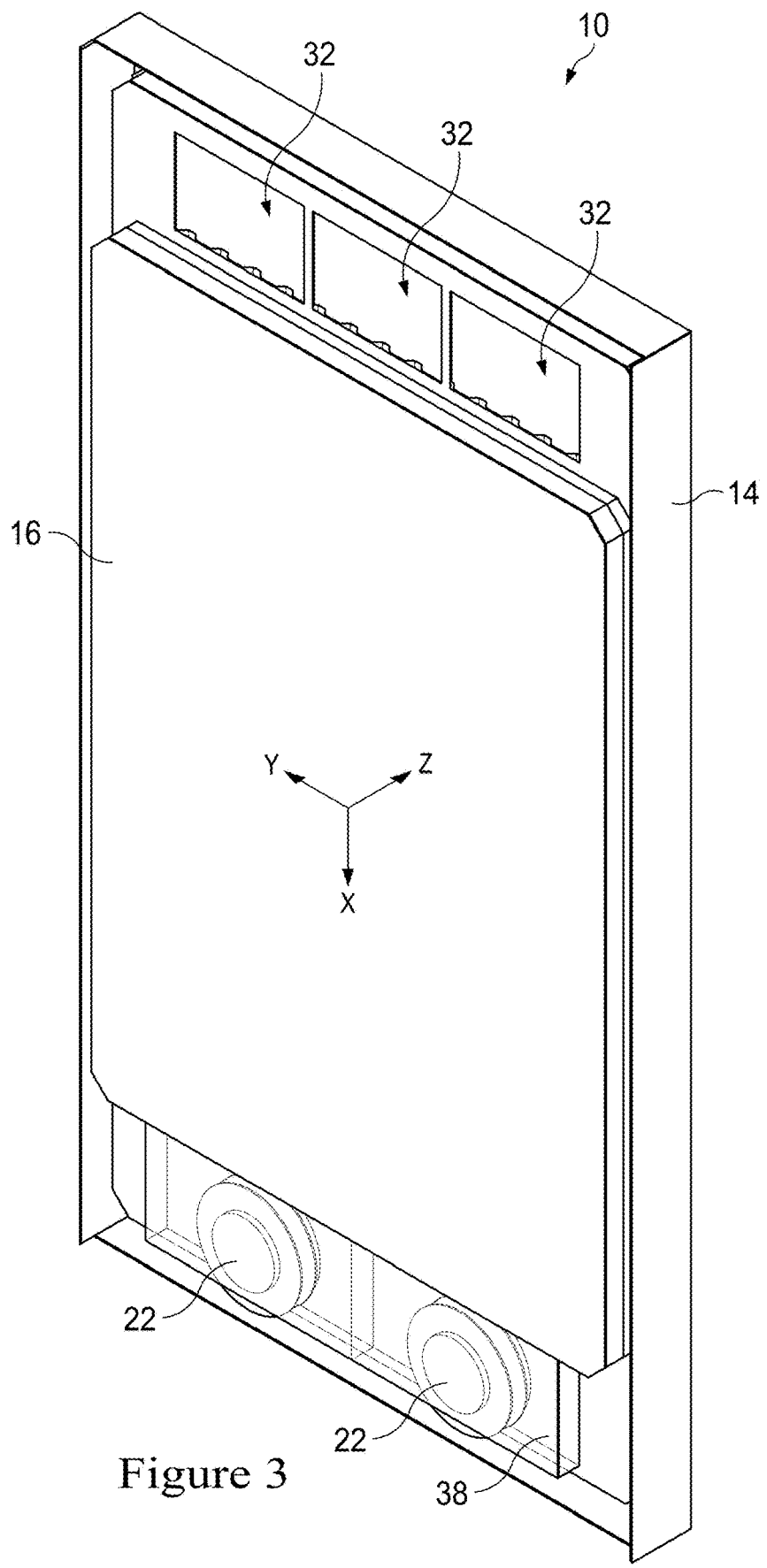
FIG. 3 is a rear perspective view of the display assembly of FIG. 1 with certain components removed to illustrate other, internal components.
Figure 4:
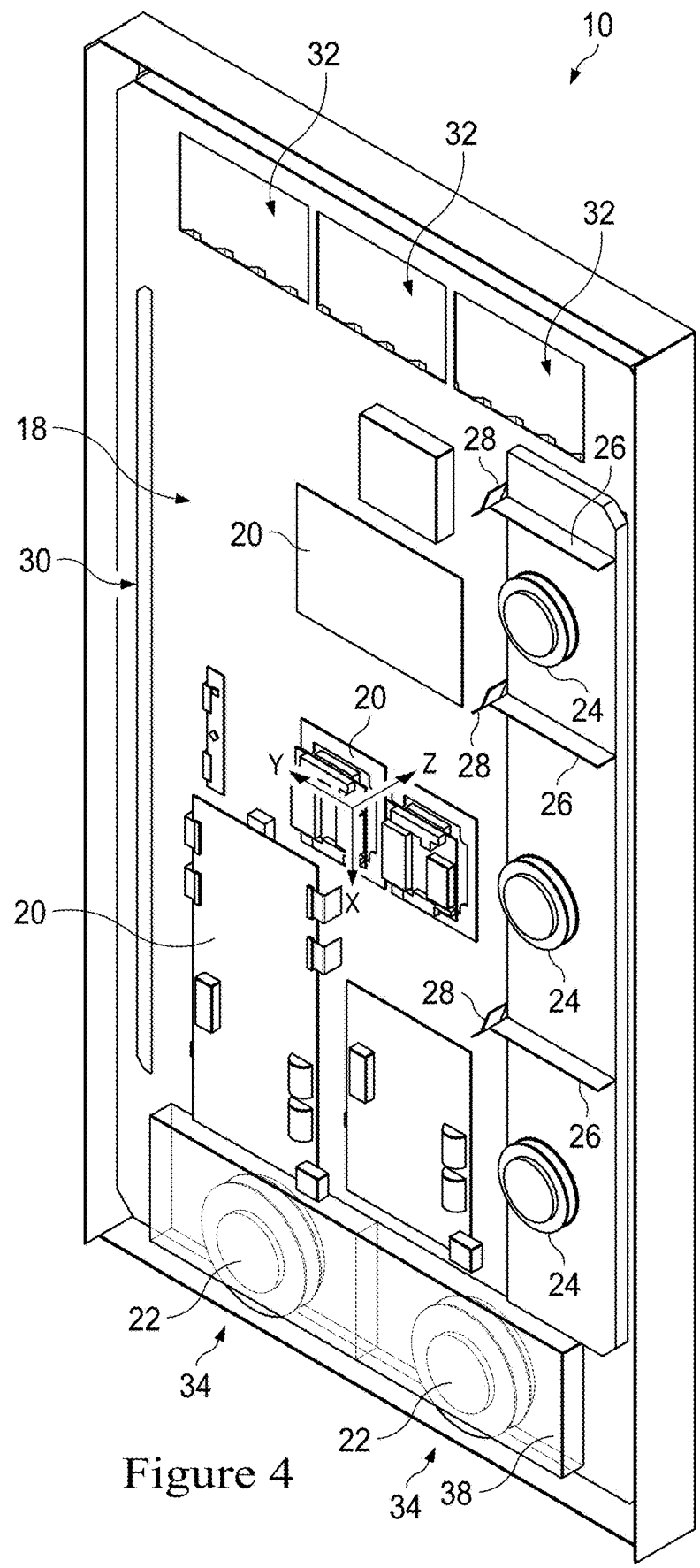
FIG. 4 is a rear perspective view of the display assembly of FIG. 3 with a rear cover removed to illustrate additional, internal components.
Figure 5:
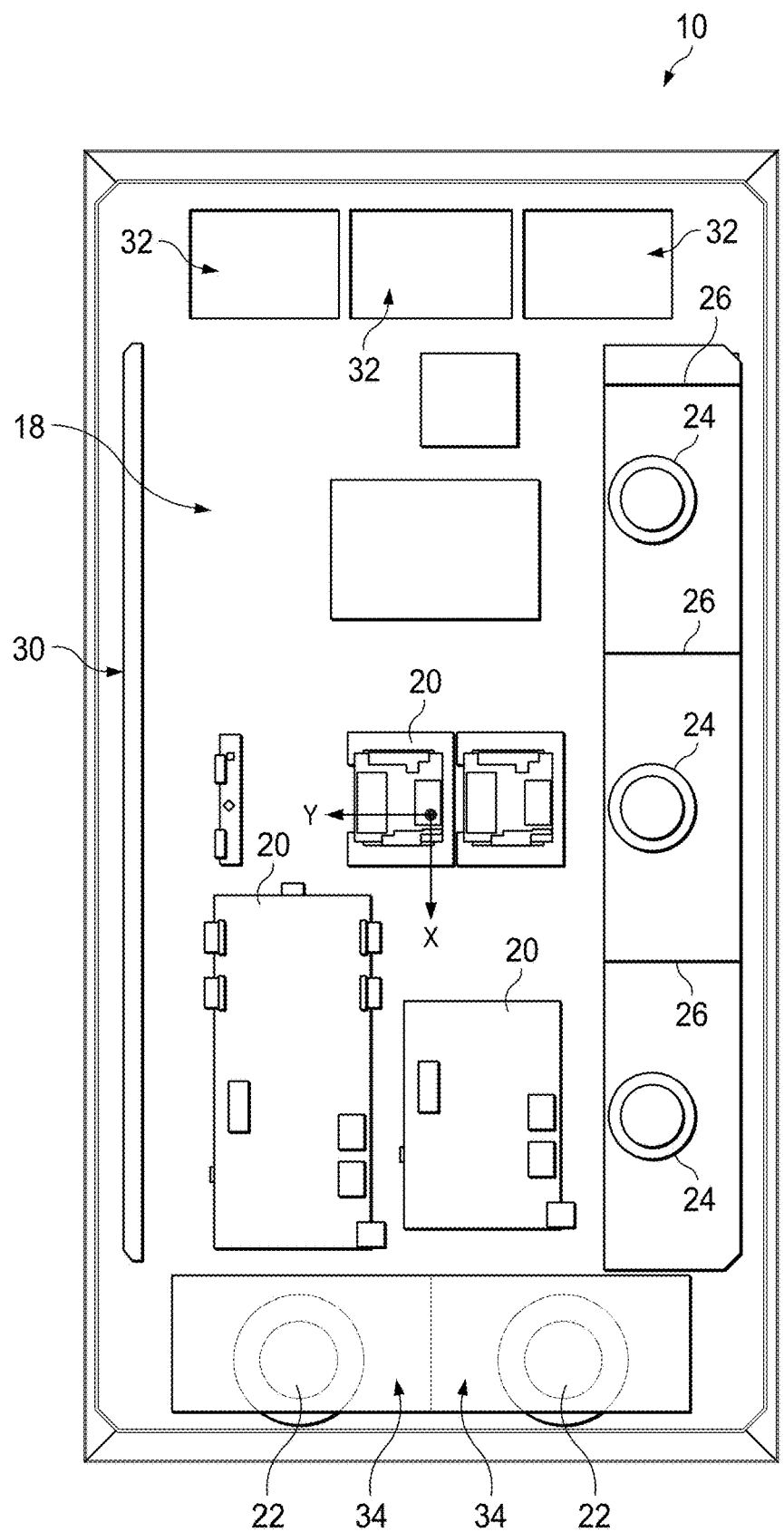
FIG. 5 is a rear view of another exemplary embodiment of the display assembly of FIG. 4.
Figure 6A:
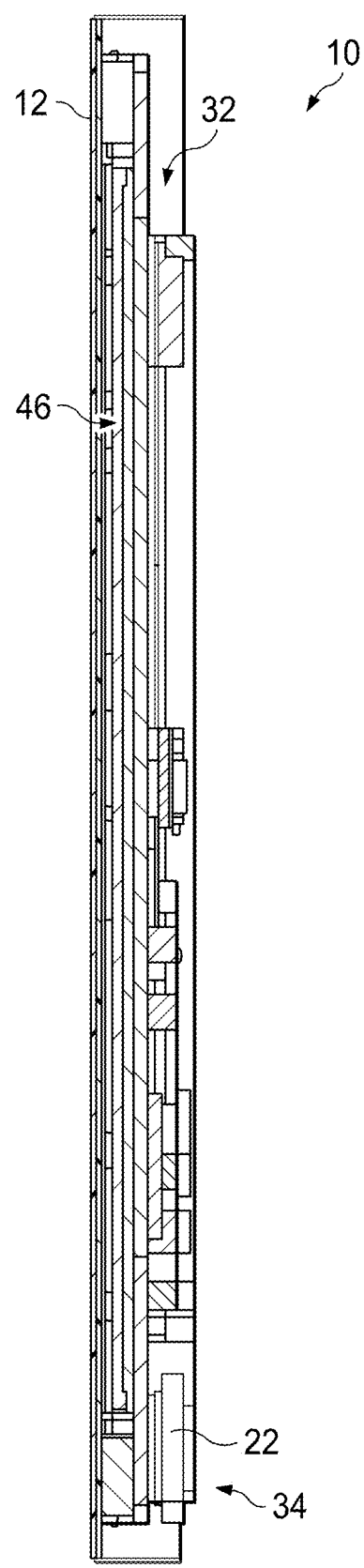
FIG. 6A is a side sectional view of the display assembly of FIG. 1 taken along section line A-A of FIG. 2.
Figure 6B:
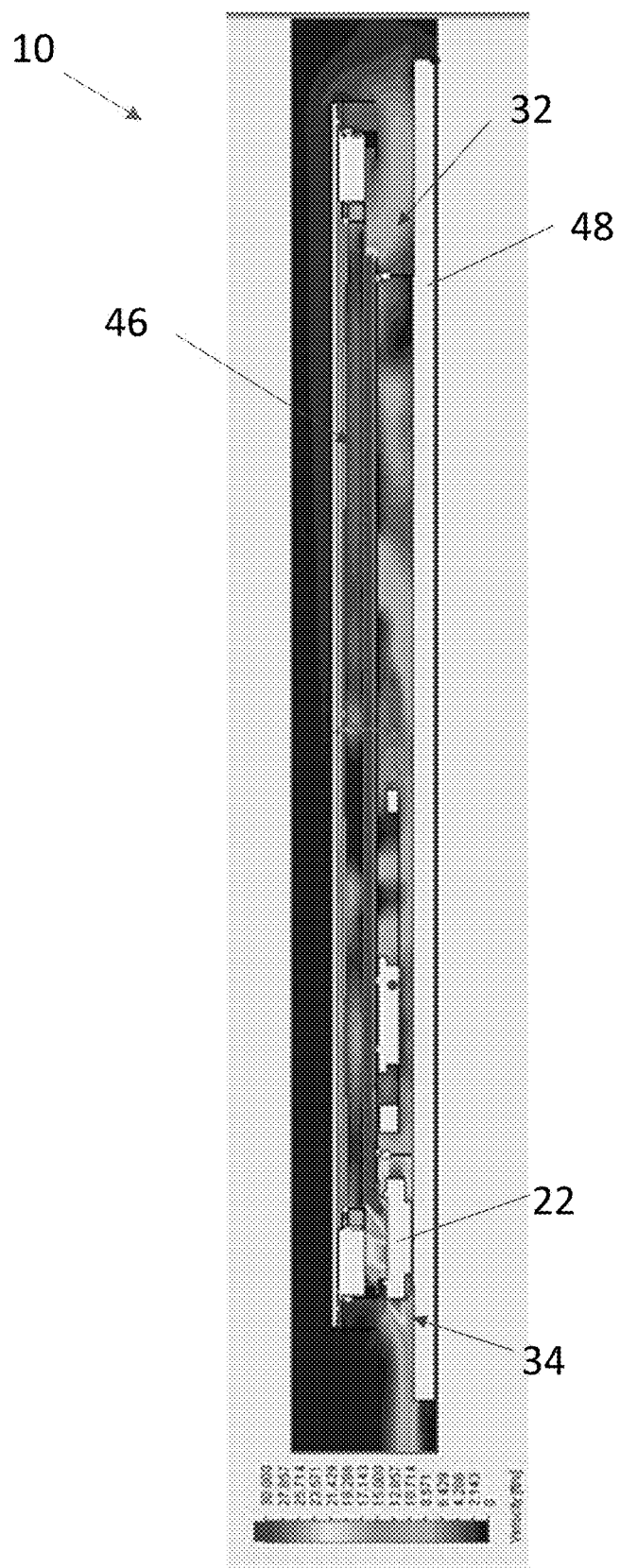
FIG. 6B is a side section view of the display assembly of FIG. 6A with an exemplary flow velocity profile demonstrating exemplary open loop airflow.
Figure 7B:
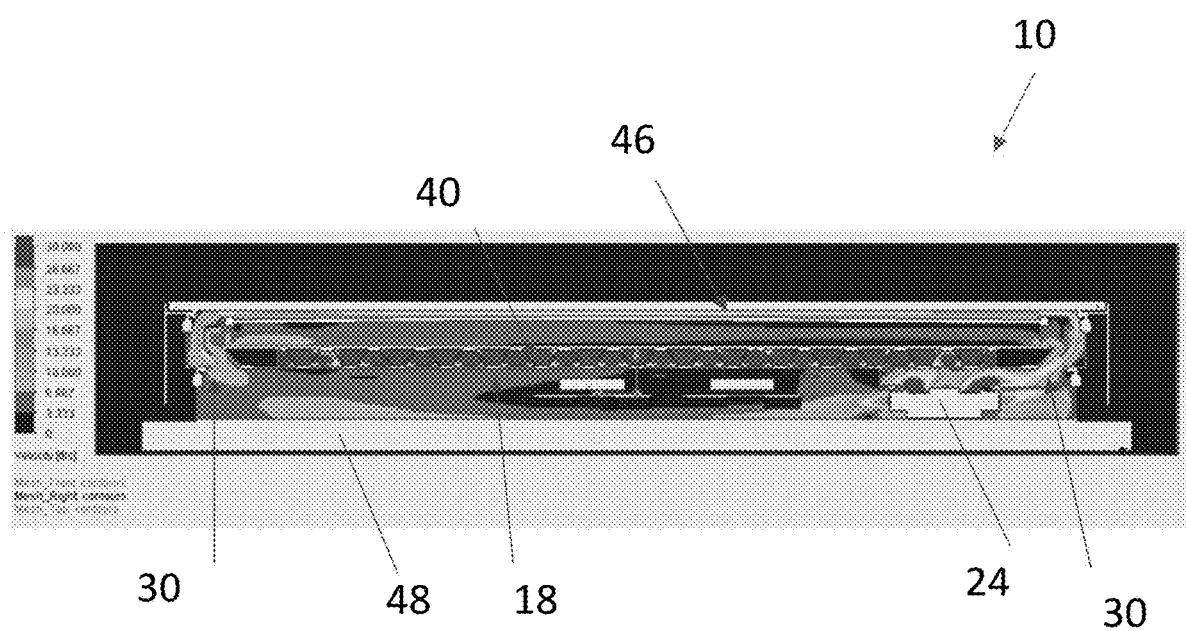
FIG. 7B is a side section view of the display assembly of FIG. 7A with an exemplary flow velocity profile demonstrating exemplary closed loop airflow.

FIG. 1 through FIG. 7B illustrate an exemplary display assembly 10. The display assembly 10 may comprise a cover 12. The cover 12 may comprise glass, acrylic, polymer, combinations thereof, or another material. In exemplary embodiments, the cover 12 may comprise multiple layers, though such is not required. The layers of the cover 12 may comprise, for example, without limitation, a polarizer (linear, circular, etc.), an anti-reflective film, an optical adhesive, some combination thereof, or the like.

The cover 12 may be located forward of, and/or may form a portion of, an electronic display subassembly 44. In exemplary embodiments, the electronic display subassembly 44 may comprise one or more display layers (which may comprise liquid crystals, though such is not required), one or more diffusion layers, a backlight (direct or edge lit), or the like. Any type of electronic display subassembly 44 may be utilized including, but not limited to, LCD, LED, OLED, cathode ray tube, plasma, some combination thereof, or the like. The electronic display subassembly 44 may be of any size, kind, or type. The electronic display subassembly 44 may be provided in any orientation, including, but not limited to, portrait and/or landscape. More than one electronic display subassembly 44 may be utilized. In such embodiments, more than one cover 12 may be utilized, though such is not required.

The cover 12 may be attached to a frame 14. In exemplary embodiments, the frame 14 may define a hollow, rectangular shape, though such is not required. The frame 14 may be configured for mounting to a ground surface (e.g., street, sidewalk, etc.), a structure 48 (e.g., wall, post, etc.), or the like.

The cover 12 may define a surface area at least as large as the electronic display subassembly 44. The cover 12 may extend parallel to said electronic display subassembly 44. A front gap 46 may be provided between the cover 12 and the electronic display subassembly 44. For example, the font gap 46 may be located between a rear surface of the cover 12 and the front surface of the electronic display subassembly 44.

A rear compartment 18 may be located rearward of the electronic display subassembly 44. The rear compartment 18 may be located between a rear cover 16 and the electronic display subassembly 44. In exemplary embodiments, the rear compartment 18 may be located between a forward surface of the rear cover 16 and a rear surface of the electronic display subassembly 44.

The rear compartment 18 may be in fluid communication with the front gap 46, such as by way of one or more side channels 30. In exemplary embodiments, a first side channel 30 may extend on a first side of the display assembly 10 and a second side channel 30 may extend on a second side of the display assembly 10 such that circulating gas may form a loop about at least a portion of the electronic display subassembly 44. The front gap 46, side channels 30, and rear compartment 18 may define a closed loop airflow pathway. The closed loop airflow pathway may encircle at least a portion of the electronic display subassembly 44, such as, but not limited to the display layer. The front gap 46, side channels 30, and rear compartment 18 may be entirely or substantially sealed to permit the continuous re-circulation of circulating gas, which may be substantially or entirely particulate free.

The circulating gas may be fully or partially isolated from ambient air. For example, without limitation, the circulating gas may comprise filtered ambient air which is recirculated one or more times. As another example, without limitation, the closed loop airflow pathway(s) may be separated from the open loop airflow pathway(s) such that the circulating gas is not permitted to substantially mix with the ambient air. However, a 100% hermetic type seal is not necessarily required between the closed loop airflow pathway(s) and the open loop airflow pathway(s) or ambient environment. Instead, the seal may be sufficient to meet one or more certain ingress protection code (IPC) standards, such as, but not limited to, IP65, IP67, or the like. The display assembly 110 may comprise one or more partitions, gaskets, walls, panels, combinations thereof, or the like, which provide separation between the ambient air in the open loop airflow pathway(s) and the circulation gas in the closed loop airflow pathway(s).

One or more electronic components 20 for operating the display assembly 10 may be located within the rear compartment 18. For example, the electronic components 20 may be located on the rear panel 16, the electronic display subassembly 44, or the like. Such electronic components 20 may comprise one or more processors, electronic storage devices, computing devices, network connectivity devices, computing devices, video players, power modules, combinations thereof, or the like.

One or more intakes 32 may be provided at the electronic display subassembly 44. The intakes 32 may be fluidly separated from the closed loop airflow pathway. The intakes 32 may be located above, or at least partially within but fluidly separated from, the rear compartment 18, though any location may be utilized. One or more exhausts 34 may be provided at the electronic display subassembly 44. The exhausts 34 may be fluidly separated from the closed loop airflow pathway. The exhausts 34 may be located below, or at least partially within but fluidly separated from, the rear compartment 18, though any location may be utilized. One or more interior channels 40 may extend between the intakes 32 and exhausts 34. In exemplary embodiments, the interior channels 40 extend along a rear surface of a backlight of the electronic display subassembly 44, though such is not required. The interior channels 40 may comprise corrugation 42. The intakes 32, exhausts 34, and interior channels 40 may define an open loop airflow pathway. The intakes 32, exhausts 34, and interior channels 40 may be configured to receive ambient air. A shroud 38 may be provided about some or all of the intakes 32 and/or exhausts 34 to fluidly seal the intakes 32 and/or exhausts 34 from the rear compartment 18.

One or more open loop fans 22 may be provided along the open loop pathway. In exemplary embodiments, the open loop fans 22 are located adjacent to each of the exhausts 34. Each of the open loop fans 22 may comprise centrifugal fans oriented such that the gas flow inlet is oriented interior to the display assembly 10, such as immediately adjacent to an exit of the interior channel 40, and a discharge of the open loop fans 22 is adjacent to an ambient environment. In this way, a substantially 90 degree turn naturally required between the interior channels 40 and the exhaust 34 may be performed by the open loop fans 22. Furthermore, the placement and/or orientation of the open loop fans 22 may provide a thinner display assembly 10.

One or more closed loop fans 24 may be provided along the closed loop airflow pathway. In exemplary embodiments, the closed loop fans 24 are located within the rear compartment 18. The closed loop fans 24 may be positioned adjacent to one of the side channels 30. Each of the closed loop fans 24 may comprise centrifugal fans oriented such that the gas flow inlet is oriented towards the front gap 46, such as along a right side of the display assembly 10 when viewed from the rear, and a discharge of the closed loop fans 24 is configured to blow the circulating gas along the rear compartment 18. In this way, a substantially 90 degree turn naturally required between the front gap 46 and the rear compartment 18 may be performed by the closed loop fans 24. Furthermore, the placement and/or orientation of the closed loop fans 24 may provide a thinner display assembly 10. The closed loop fans 24 may further provide increased distribution of air within at least the rear compartment 18. For example, without limitation, the closed loop fans 24 may be centrifugal fans provided without certain customary shrouding, which may increase the number of directions the discharged air is distributed.

Dividers 26 may be positioned between at least some, or all, of the closed loop fans 24, though such dividers 26 are not required. The dividers 26 may provide some direction for airflow distribution through the rear compartment 18. Optionally, airflow deflection elements 28 may be positioned on distal ends of the dividers 26 or otherwise adjacent to the discharge of the closed loop fans 24 to further control airflow. The airflow deflection elements 28 may comprise plates with various surface features, angles, holes, any combination thereof, or the like to direct airflow.

Figure 8:
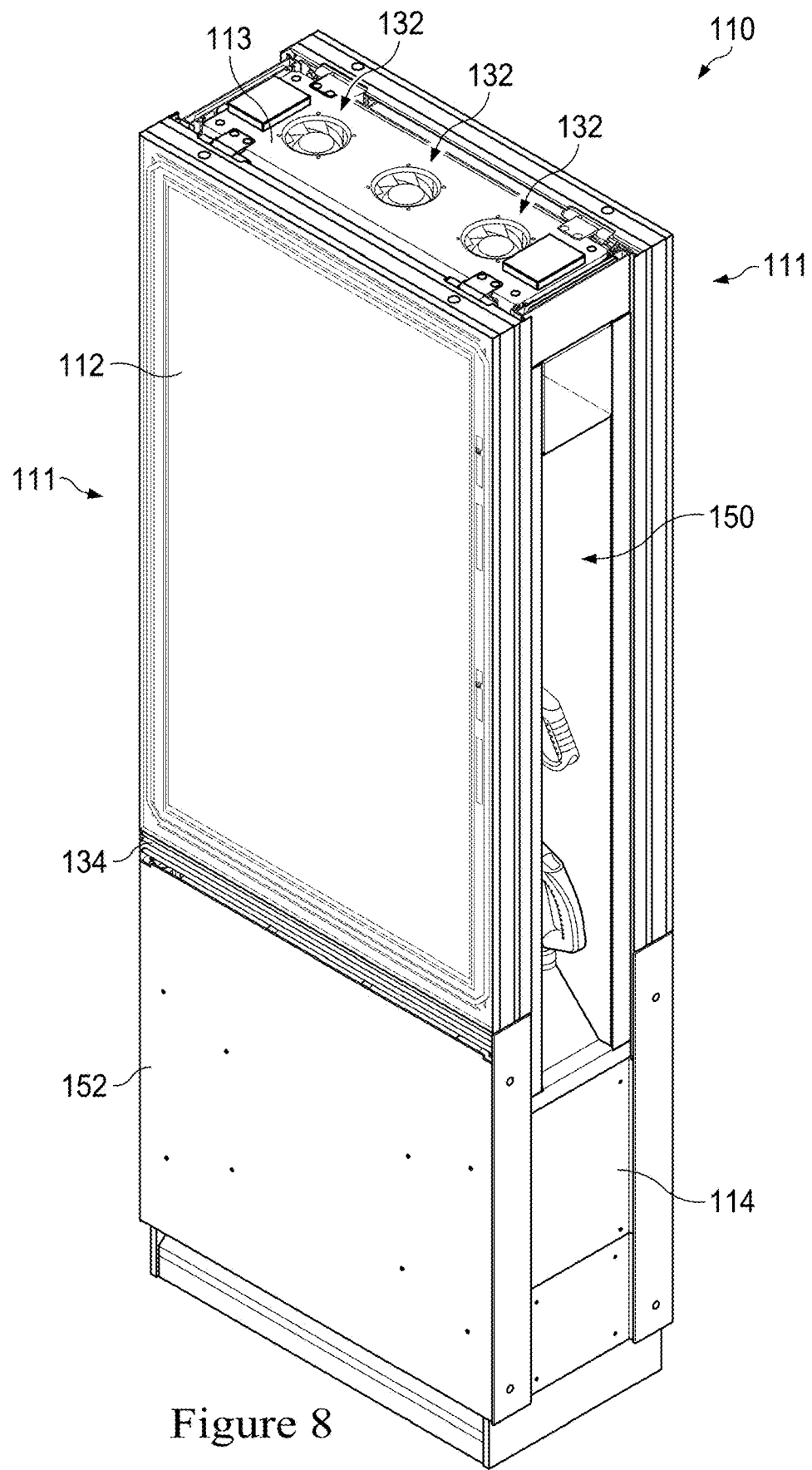
FIG. 8 is a front perspective view of another exemplary display assembly in accordance with the present invention.
Figure 9:
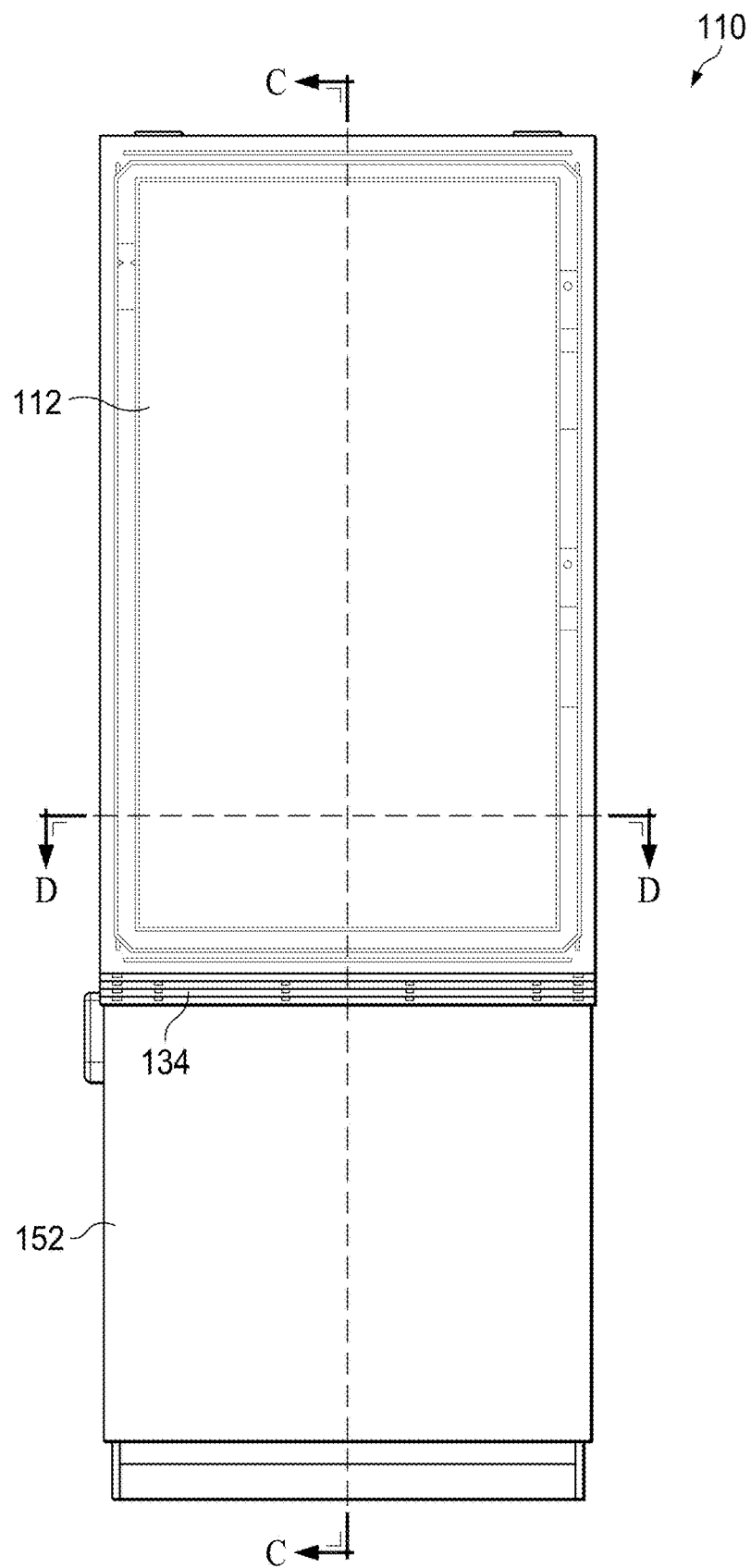
FIG. 9 is a front view of the display assembly of FIG. 8.
Figure 10A:
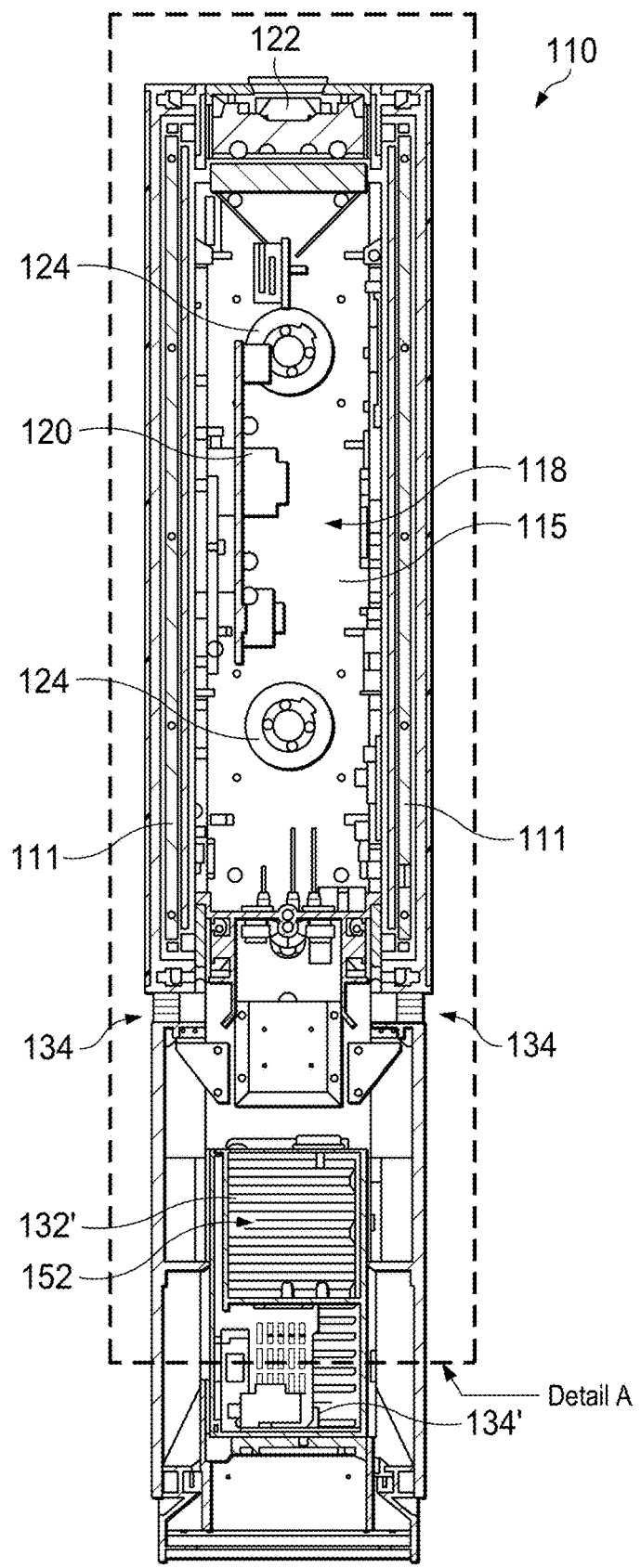
FIG. 10A is a side sectional view of the display assembly of FIG. 8 taken along section line C-C of FIG. 9.
Figure 10B:
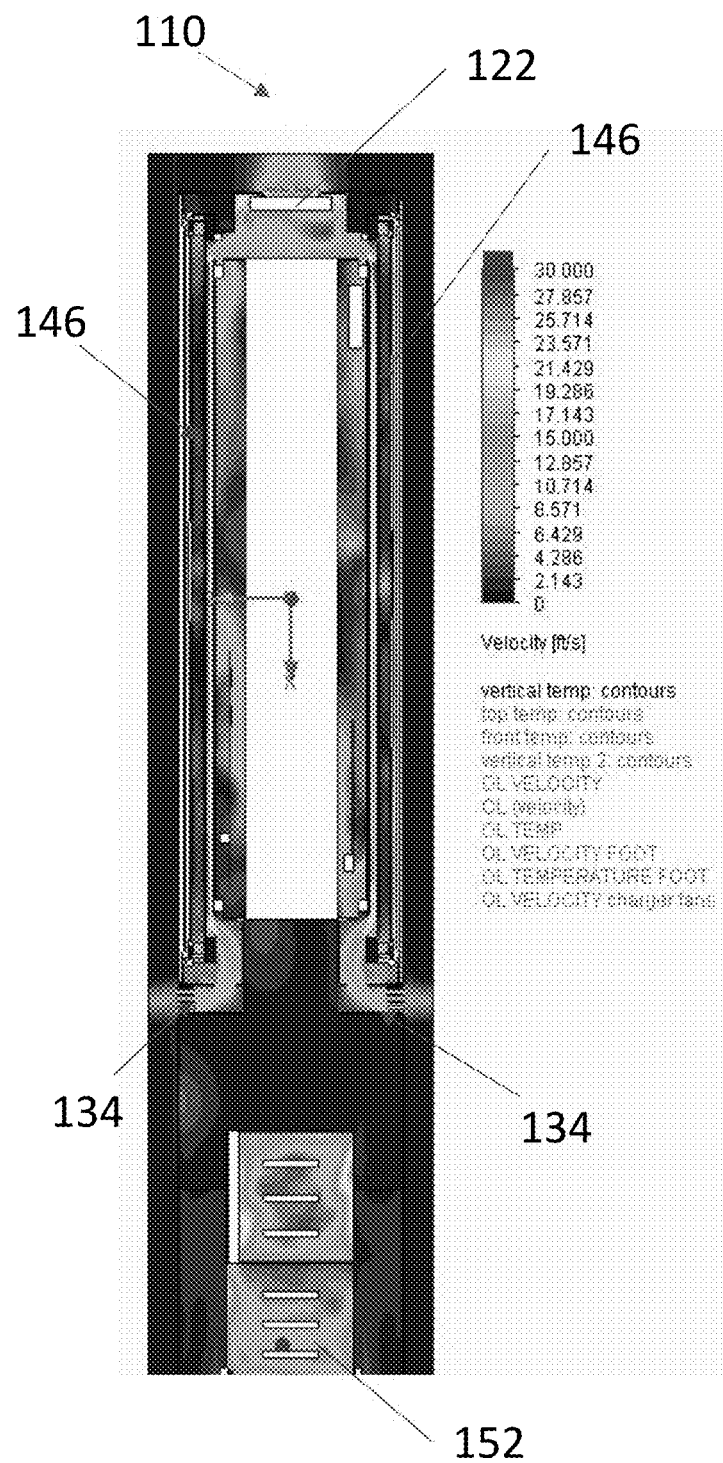
FIG. 10B is a detailed side section view of the display assembly of FIG. 10A taken from detail A of FIG. 10A with an exemplary flow velocity profile demonstrating exemplary open loop airflow.
Figure 11A:
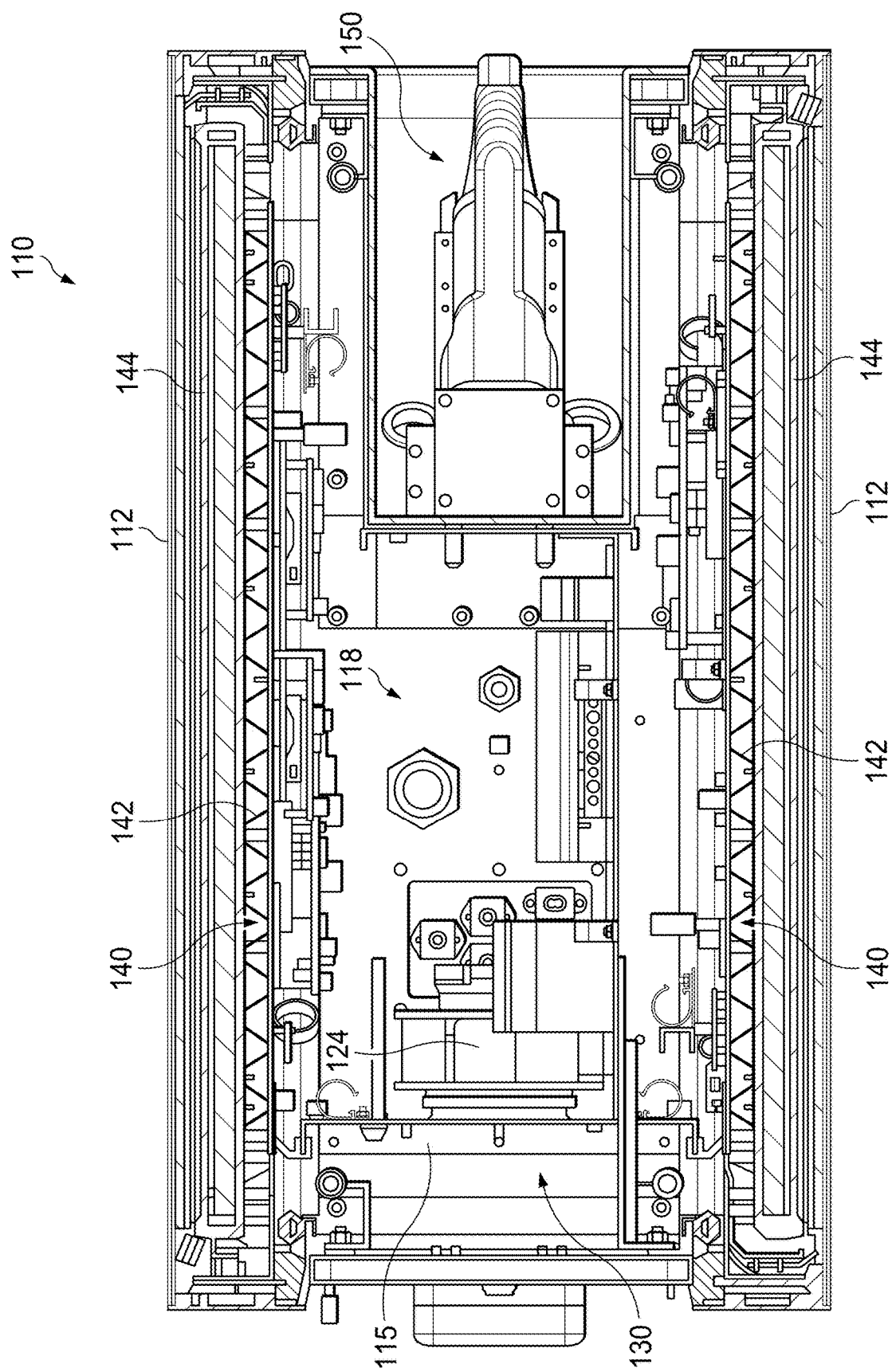
FIG. 11A is a top sectional view of the display assembly of FIG. 8 taken along section line D-D of FIG. 9.
Figure 11B:
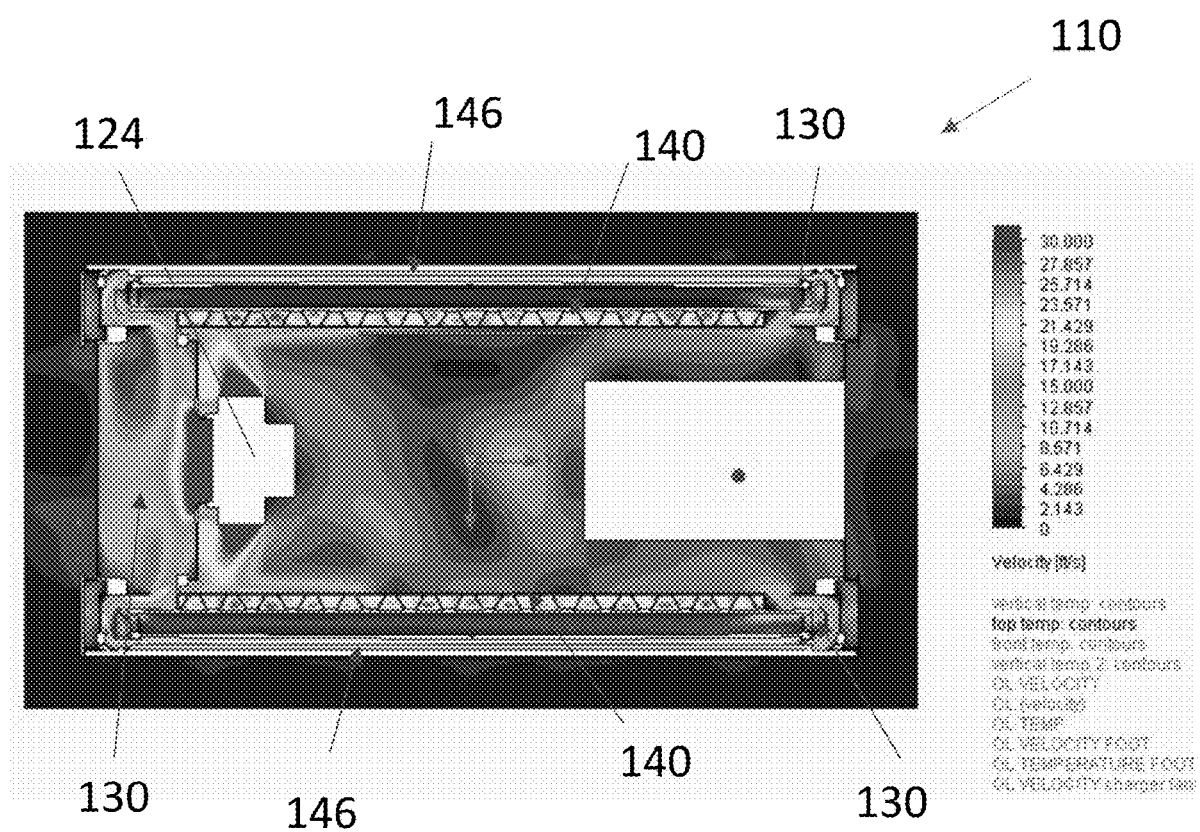
FIG. 11B is a side section view of the display assembly of FIG. 11A with an exemplary flow velocity profile demonstrating exemplary closed loop airflow.
Figure 12:
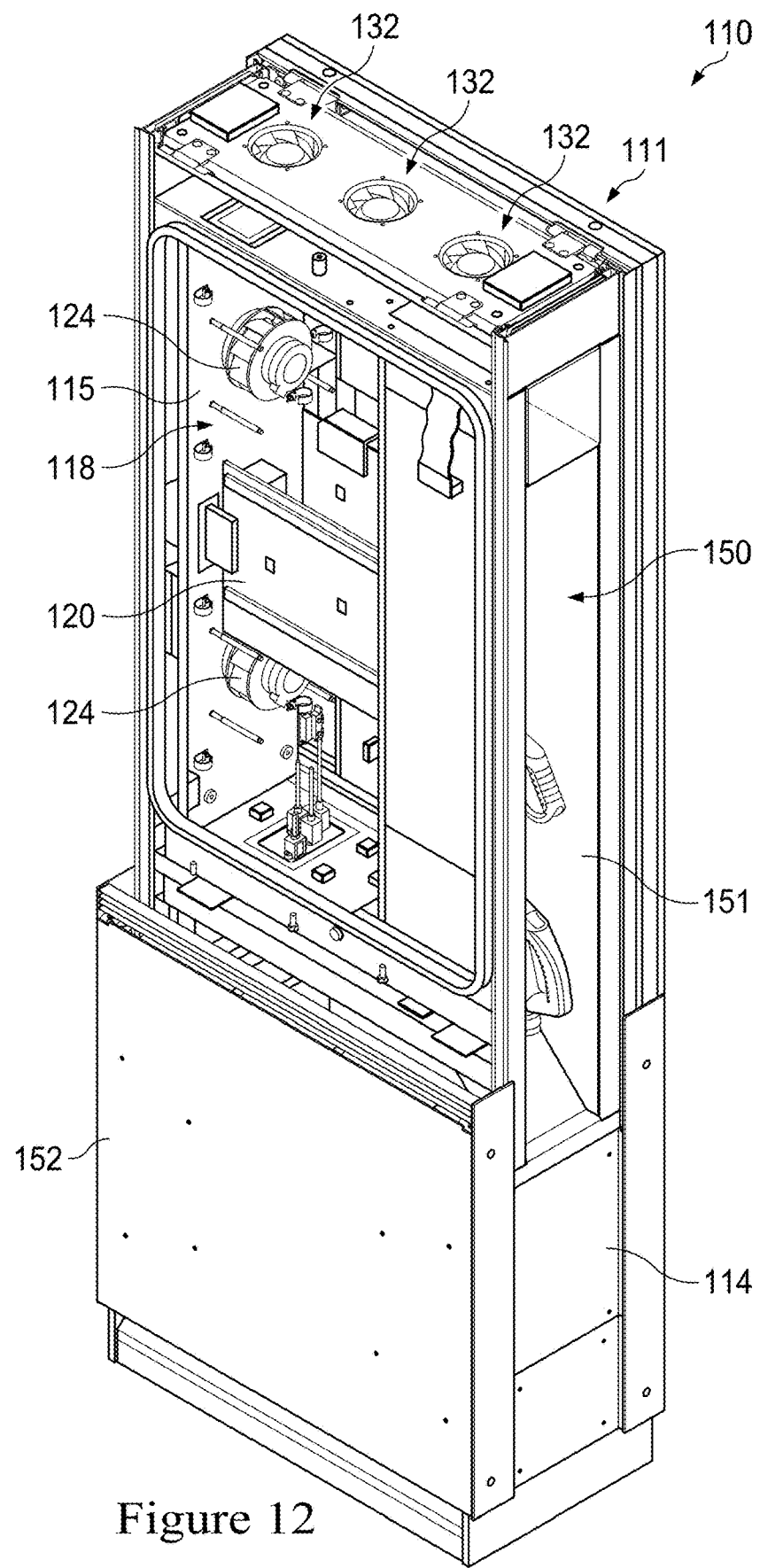
FIG. 12 is a front perspective view of the display assembly of FIG. 8 with certain components removed to illustrate certain internal components.
Figure 13:
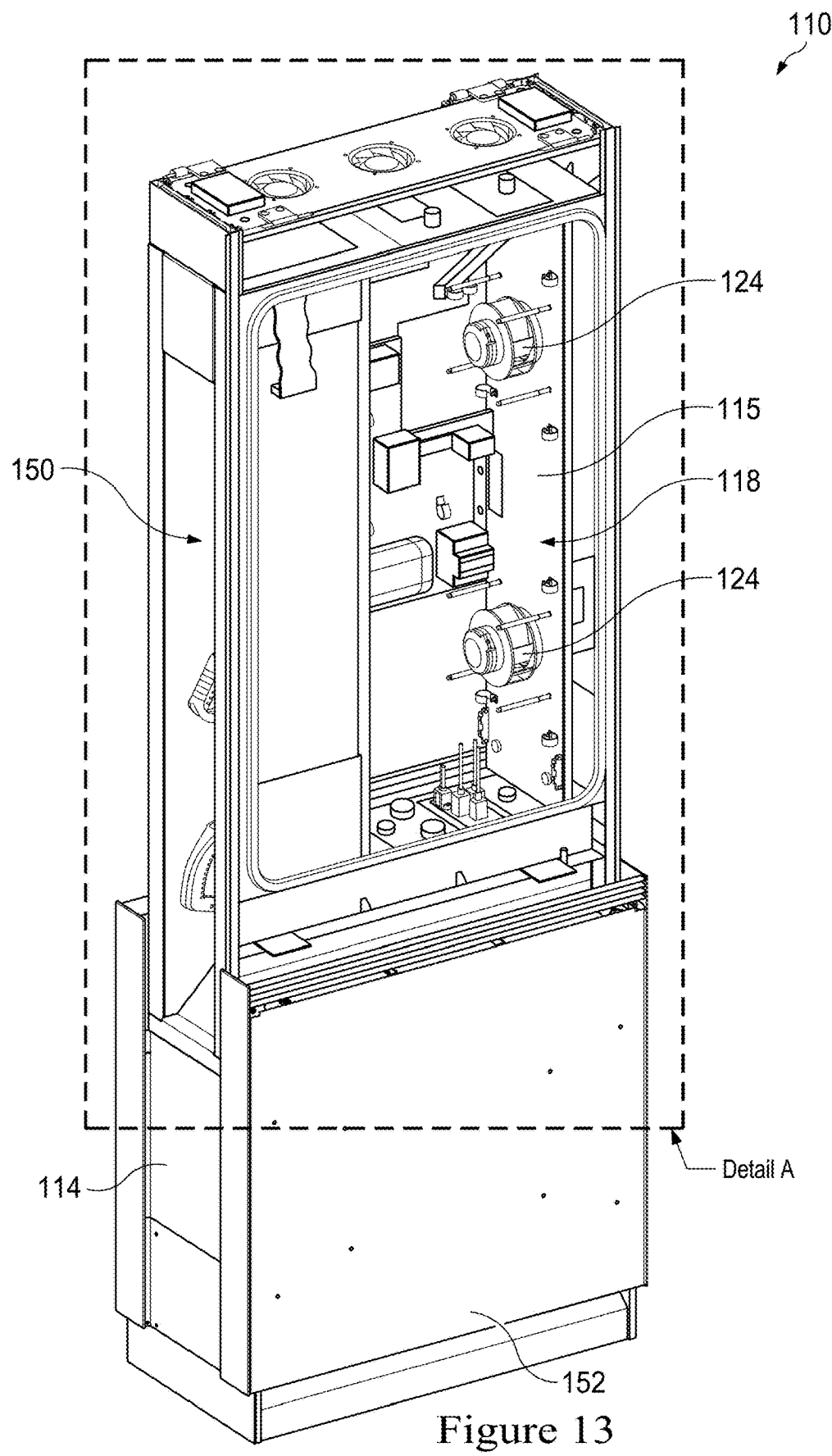
FIG. 13 is a rear perspective view of the display assembly of FIG. 8 with certain components removed to illustrate certain internal components.
Figure 14:
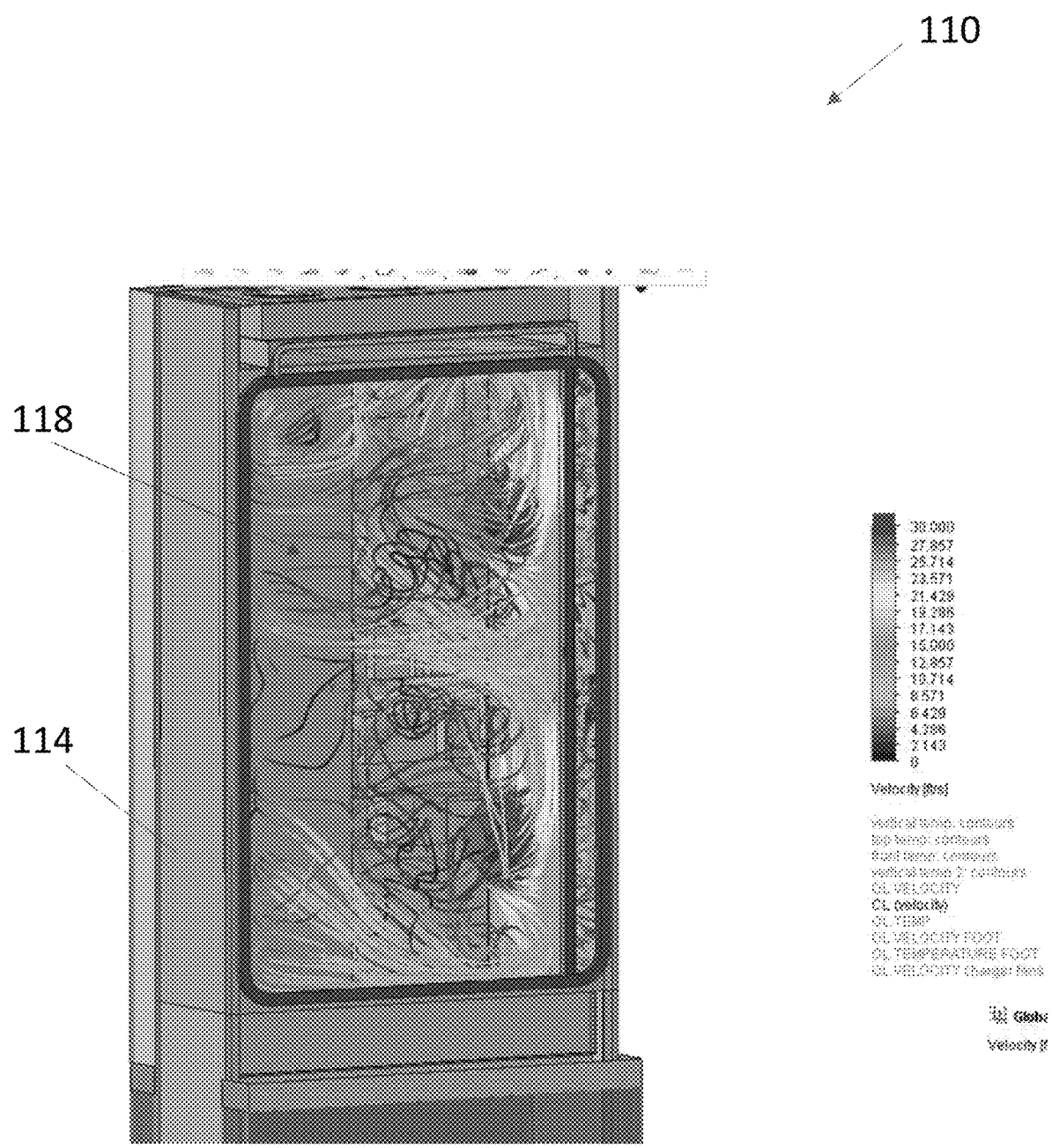
FIG. 14 is a detailed rear perspective view of the display assembly of FIG. 8 taken from detail A of FIG. 13 with an exemplary flow path profile for demonstrating exemplary closed loop airflow.

FIG. 8 through FIG. 14 illustrate another exemplary display assembly 110 in accordance with the present invention. The same or the similar features may be numbered similarly but increased by 100 (e.g., 10 to 110). The display assembly 110 may comprise one or more side assemblies 111. In exemplary embodiments, a first side assembly 111 is positioned opposite a second side assembly 111, though any number and arrangement of side assemblies 111 may be utilized. Each side assembly 111 may, in exemplary embodiments, comprise a cover 112, an electronic display subassembly 144, a front gap 146, an interior channel 140, corrugation 142, and side channels 130. Common or dedicated intakes 132 and exhausts 134 may be provided for the various side assemblies 111 and may form part of the open loop pathway(s) through the display assembly 110. In exemplary embodiments, common intakes 132 and dedicated exhausts 134 are utilized. In other exemplary embodiments, separate intakes 132 and exhausts 134 are utilized so that each open loop airflow pathway has a dedicated airflow pathway. In this manner, ingested ambient air may remain entirely or substantially separated from one another while within the display assembly 10.

A common cavity 118 may be provided between two or more of the side assemblies 111 and may form part of a closed loop airflow pathway for each of the side assemblies 111. However, dedicated cavities 118 for each side assembly 111 may be utilized in other exemplary embodiments.

Electronic components 120 may be provided within the common cavity 118. For example, without limitation, such electronic components 120 may be provided at or along one or more of rear surfaces of the side assemblies 111. The common cavity 118, in exemplary embodiments, may be fluidly separated from ambient air. In this way, the electronic components 120 may be only exposed to circulating gas, which may be temperature controlled and/or kept substantially free of moisture, particulate, and/or other potential contaminants.

In exemplary embodiments, each side assembly 111 is moveably attached to a frame 114. Each of the open loop fans 122 are provided at or along an upper panel 113 at or along another panel of said frame 114. Said open loop fans 122 may be oriented such that a gas flow inlet faces upward to the ambient environment and a discharge portion is oriented to distribute ingested ambient air about the interior of the display assembly 10 for improved evenness of distribution to the side assemblies 111, as particularly illustrated with respect to FIG. 10B. In exemplary embodiments, the open loop fans 122 may comprise centrifugal fans lacking certain shrouding features such that air is partially or wholly distributed about the open loop fans 122 to provide more even distribution.

In exemplary embodiments, each of the closed loop fans 124 may be provided along a side panel 115 at or along said frame 114. Each of the closed loop fans 124 may be oriented such that the gas flow intake ingests air from the front gaps 146 of each of the side assemblies 111 and is discharged about the common cavity 118, as particularly illustrated with respect to FIGS. 11B and 14. In exemplary embodiments, the closed loop fans 124 may comprise centrifugal fans lacking certain shrouding features such that air is partially or wholly distributed about the closed loop fans 124 to provide more even distribution.

Examples of centrifugal fans shown and/or described herein may include, for example, without limitation, those provided by Sanyo Denki Co. Ltd. having a US office in Torrance, California under the San Ace brand (https://products.sanyodenki.com/en/sanace/dc/centrifugal-fan/). Such centrifugal fans may be utilized in 150 mm, 133 mm, and/or 100 mm to name a few examples, without limitation. The centrifugal fans may be provided without some or all of the certain conventional shroud elements such that air is discharged about some or all of the fans. This may improve air distribution. As such centrifugal fans are interior to the display assembly 110, user safety may not be impacted by removing such shrouding elements.

Provided herein are certain exemplary test results from use of such centrifugal fans, as compared to axial fans within certain exemplary display assemblies 10, 100. Such centrifugal fans may be provided as open loop fans 22 and/or closed loop fans 24.

TABLE 1

Centrifugal Fan Results
centrifugal
content white

| ft/min | ft/min | Zone | Zone Area (in2) | contributing area (in2) | contributing mass flow | |
|---|---|---|---|---|---|---|
|  | 470 | 1 | 28.27 | 7.0675 | 23.06753472 | same as 9 |
| 430 | 440 | 2 | 21.99 | 5.4975 | 16.79791667 |  |
| 430 | 450 | 3 | 15.71 | 3.9275 | 12.2734375 |  |
| 450 | 450 | 4 | 9.42 | 2.355 | 7.359375 |  |
| 450 | 450 | 5 | 3.14 | 3.14 | 9.8125 |  |
| 440 | 450 | 4 | 9.42 | 2.355 | 7.359375 |  |
| 430 | 450 | 3 | 15.71 | 3.9275 | 12.2734375 |  |
| 440 | 450 | 2 | 21.99 | 5.4975 | 17.1796875 |  |
| 445 | 470 | 1 | 28.27 | 7.0675 | 23.06753472 |  |
|  | 470 | 1 | 28.27 | 7.0675 | 23.06753472 | same as 9 |
| 415 | 415 | 2 | 21.99 | 5.4975 | 15.84348958 |  |
| 425 | 430 | 3 | 15.71 | 3.9275 | 11.72795139 |  |
| 430 | 430 | 4 | 9.42 | 2.355 | 7.032291667 |  |
| 435 | 440 | 5 | 3.14 | 3.14 | 9.594444444 |  |
| 440 | 450 | 4 | 9.42 | 2.355 | 7.359375 |  |
| 440 | 450 | 3 | 15.71 | 3.9275 | 12.2734375 |  |
| 440 | 460 | 2 | 21.99 | 5.4975 | 17.56145833 |  |
| 440 | 470 | 1 | 28.27 | 7.0675 | 23.06753472 |  |
|  |  |  |  | Total Centrifugal Mass Flow | 257 |  |

TABLE 2

Axial Fan Results
92
content white

| ft/min | ft/min | Zone | Zone Area (in2) | contributing area (in2) | contributing mass flow |
|---|---|---|---|---|---|
|  | 460 | 1 | 28.27 | 7.0675 | 22.57673611 |
| 435 | 420 | 2 | 21.99 | 5.4975 | 16.034375 |
| 440 | 440 | 3 | 15.71 | 3.9275 | 12.00069444 |
| 460 | 450 | 4 | 9.42 | 2.355 | 7.359375 |
| 465 | 460 | 5 | 3.14 | 3.14 | 10.03055556 |
| 465 | 450 | 4 | 9.42 | 2.355 | 7.359375 |
| 460 | 460 | 3 | 15.71 | 3.9275 | 12.54618056 |
| 460 | 470 | 2 | 21.99 | 5.4975 | 17.94322917 |
| 450 | 460 | 1 | 28.27 | 7.0675 | 22.57673611 |
|  | 400 | 1 | 28.27 | 7.0675 | 19.63194444 |
| 440 | 450 | 2 | 21.99 | 5.4975 | 17.1796875 |
| 480 | 465 | 3 | 15.71 | 3.9275 | 12.68255208 |
| 480 | 460 | 4 | 9.42 | 2.355 | 7.522916667 |
| 475 | 460 | 5 | 3.14 | 3.14 | 10.03055556 |
| 460 | 430 | 4 | 9.42 | 2.355 | 7.032291667 |
| 420 | 410 | 3 | 15.71 | 3.9275 | 11.18246528 |
| 410 | 410 | 2 | 21.99 | 5.4975 | 15.65260417 |
| 400 | 400 | 1 | 28.27 | 7.0675 | 19.63194444 |
|  |  |  |  | Total 92 Axial Mass Flow | 249 |

As demonstrated from the above, better mass flow rate is achieved with the use of centrifugal fans. The use of such centrifugal fans also resulted in about four times less noise and about half the power usage as the axial fans. The presented testing results are for exemplary demonstration purposes and are in no way intended to be limiting.

In certain exemplary embodiments, electric vehicle charging equipment 150 may be provided at, or in association with, the display assemblies 10, 110. The electric vehicle charging equipment 150 in exemplary embodiments may be anchored to the frame 114 and/or the ground or other surface (directly or indirectly). The electric vehicle charging equipment 150 in exemplary embodiments may be electrically connected to the same power source as used to power the display assembly 10, 110, which may include utility power, battery power, solar power, combinations thereof, or the like. Some or all of the electric vehicle charging equipment 150 may be located between the side assemblies 111, though some or all of the electric vehicle charging equipment 150 may be located elsewhere.

The frame 114 may be adapted to accommodate the electrical vehicle charging equipment 150. For example, without limitation, the frame 114 may comprise a recessed portion comprising, or configured to accommodate, a housing 151 for at least some of the electric vehicle charging equipment 150 that extends into a portion of the cavity 118. The electric vehicle charging equipment 150 may be fully or partially recessed when a handle or other electric vehicle connection portion of the electric vehicle charging equipment 150 is docked at the display assembly 110 (e.g., not in use), such as at a receiver at or within the housing 151. For example, without limitation, a cord and/or the handle portion of the electric vehicle charging equipment 150 may extend from the frame 114 and/or outside of the housing 151. In exemplary embodiments, the electrical vehicle charging equipment 150 may be attached to a portion of the frame 114 extending between the side assemblies 111 such that the electrical vehicle charging equipment 150 is accessible from the side. Placing the electrical vehicle charging equipment 150 between the side assemblies 111 may result in a shorter overall height of the display assembly 110 which may be particularly advantageous for shipping.

One or more separate intakes/exhausts 132/134 and open and/or closed loop airflow pathways may be provided for some or all of the electric vehicle charging equipment 150, though such is not required. For example, some or all of the electric vehicle charging equipment 150 may have a dedicated open loop airflow pathway separate from other open loop airflow pathways for the display assembly 110. Alternatively, or additionally, the airflow for the electric vehicle charging equipment 150 may share one or more common intakes/exhausts 132/134 and open and/or closed loop airflow pathways with the side assemblies 111. For example, some or all of the electric vehicle charging equipment 150 may share an open loop airflow pathway with at least one of the side assemblies 111. Alternatively, or additionally, some or all of the electric vehicle charging equipment 150 may be thermally managed, at least in part, by the circulating gas within the common cavity 118. For example, without limitation, the circulating gas within the common cavity 118 may pass over interior surfaces of the housing 151 that extend within the common cavity 118, and/or certain power or other electronic components mounted at such interior surfaces of the housing 151 or otherwise within the common cavity 118.

The display assembly 110 may be configured to accommodate one or multiple electric vehicle chargers and related equipment 150. The display assembly 110 may be configured to accommodate various sizes and/or types of electric vehicle chargers and related equipment 150 positioned at various locations of the display assembly 110. For example, without limitation, electric vehicle connector portions (e.g., handles, plugs, outlets, adapters, connectors, or other components for docking with electric vehicles) may be provided at each side of the display assembly 110 for connecting with EV to charge the EV.

One or more additional equipment cavities 152 may be provided below, above, and/or adjacent to the side assemblies 111. For example, without limitation, a single additional equipment cavity 152 may be provided below, and at least partially between, the side assemblies 111. Electronic components 120 may be provided within the additional equipment cavity or cavities 152. Such electronic components 120 may comprise, for example, without limitation, components for operating the side assemblies 111 (e.g., electronic storage devices, processors, video players, network connectivity devices, power supplies, sensors, combinations thereof, or the like), components of, or for operating, the electric vehicle charging equipment 150 (e.g., power supplies, power transformers, capacitors, charge load centers, power meters, wiring, cords, handles, adapters, etc.), customer equipment or components for operating the same (e.g., network connectivity devices, cameras, sensors, microphones, telephonic equipment, emergency beacons, etc.), combinations thereof, or the like. More than one additional equipment cavity 152 at more than one location may be provided.

Some or all of the additional equipment cavities 152 may comprise shared or dedicated thermal management and/or power supplies with the side assemblies 111. In exemplary embodiments, without limitation, one or more separate intakes 132 and exhausts 134 are provided to facilitate a dedicated open loop airflow pathway through the additional equipment cavity 152. In other exemplary embodiments, without limitation, the additional equipment cavity 152 may share intakes 132 and/or exhausts 134 with one or more of the side assemblies 111, or otherwise form part of the open loop airflow pathways for the side assemblies 111.

Some or all of the electric vehicle ("EV") charging equipment 150 may be fully or partially recessed between the side assemblies 111. The EV charging equipment 150 may be connected, directly or indirectly, to the frame 114 and/or the side assemblies 111. Certain components of the EV charging equipment 150, such as, but not limited to, handles, connectors, adapters, cords, holsters, docks, combinations thereof, or the like may be fully or partially external to the display assembly 110. External components of the EV charging equipment 150 may be provided at, outside of, or connected to, exterior surfaces of a housing 151. The housing 151 may be fully or partially recessed into the common cavity 118 between the side assemblies 111. The size and/or shape of the housing 151 may be configured to accommodate various types or kinds of EV charging equipment 150. Certain components of the EV charging equipment 150, such as, but not limited to, power supplies, power regulators, transformers, power meters, batteries, electric grid connectors, combinations thereof, or the like may be fully or partially internal to the display assembly 110. Internal components of the EV charging equipment 150 may be provided within or at the side assemblies 111 and/or the additional equipment cavity or cavities 152. The additional equipment cavity 152 may comprise one or more ambient air pathways, which may be dedicated or form part of other open loop airflow pathways within the display assemblies 110. For example, without limitation, the additional equipment cavity 152 may comprise its own intake 132' and may utilize one or more of the exhausts 134 utilized by the side assemblies 111. As another example, without limitation, the additional equipment cavity 152 may comprise its own dedicated intake 132' and its own dedicated exhaust 134' such that ambient air circulating about the EV charging equipment 150 and/or other components in the additional equipment cavity 152 is kept separate from other open loop air.

The EV charging equipment 150 may comprise any type or kind of EV charger and associated equipment, such as but not limited to a level 2 charger.

Figure 15A:
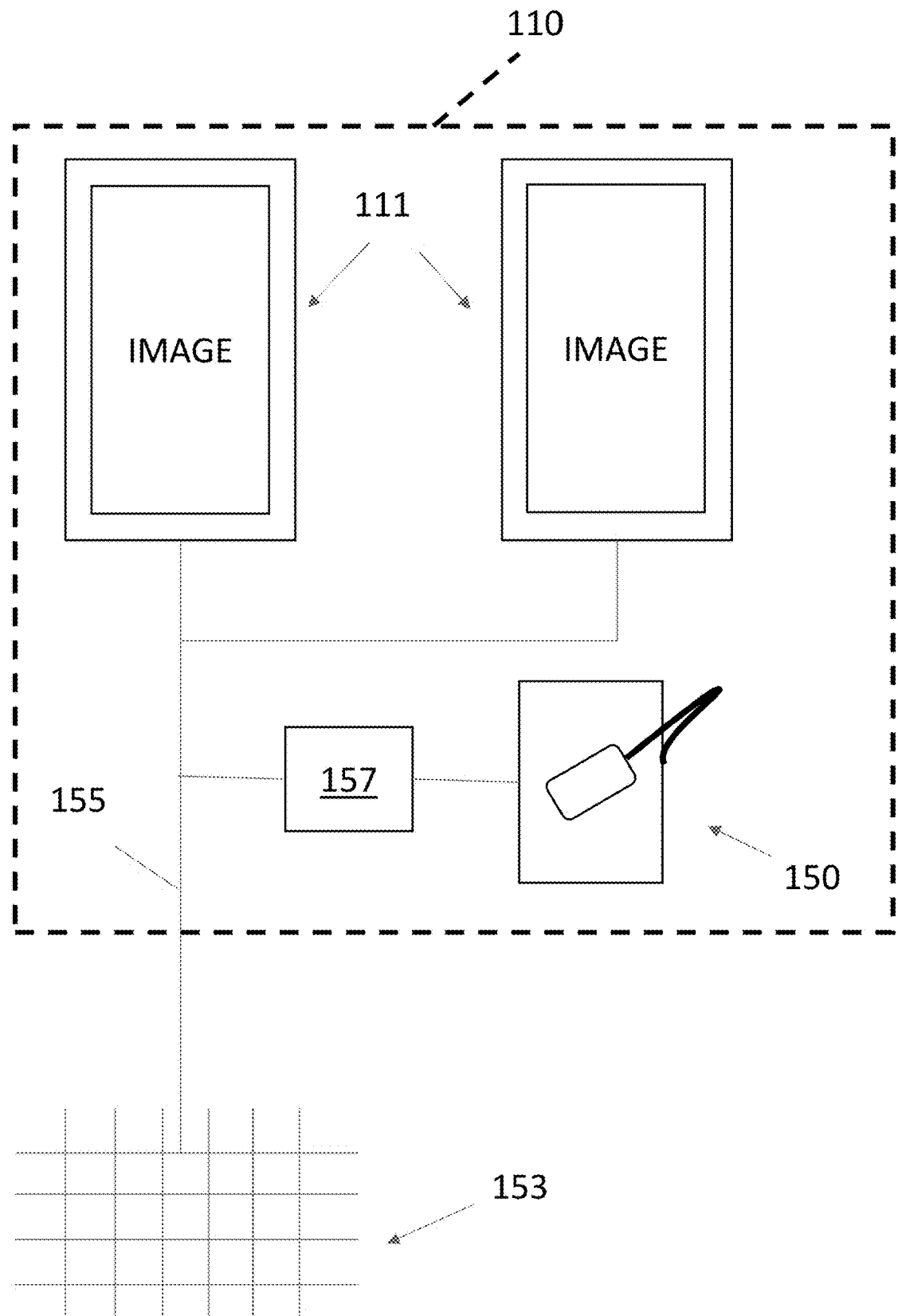
FIG. 15A is a plan view of an exemplary electrical schematic for the display assembly of FIGS. 1-14.
Figure 15B:
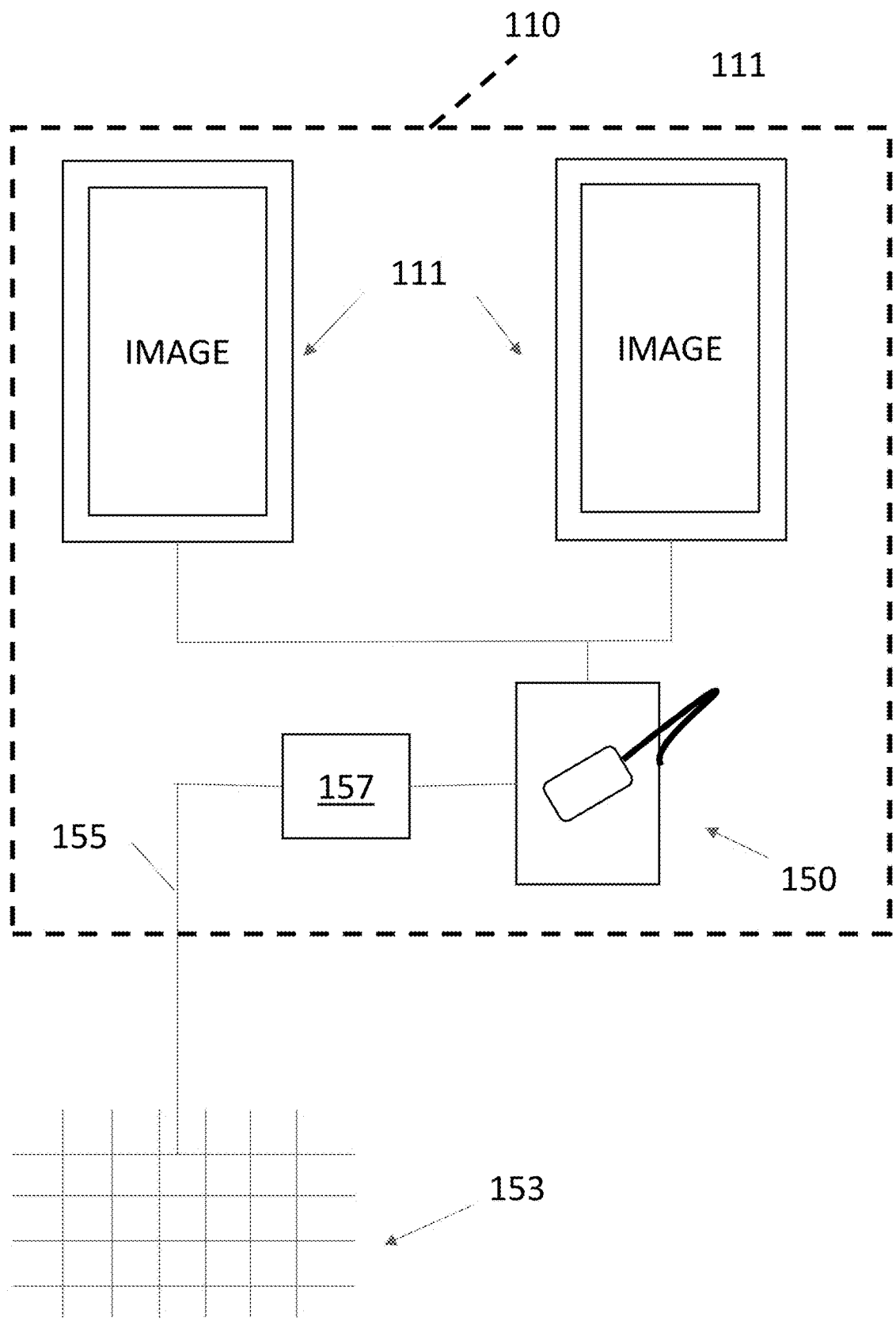
FIG. 15B is a plan view of another exemplary electrical schematic for the display assembly of FIGS. 1-14.
Figure 15C:
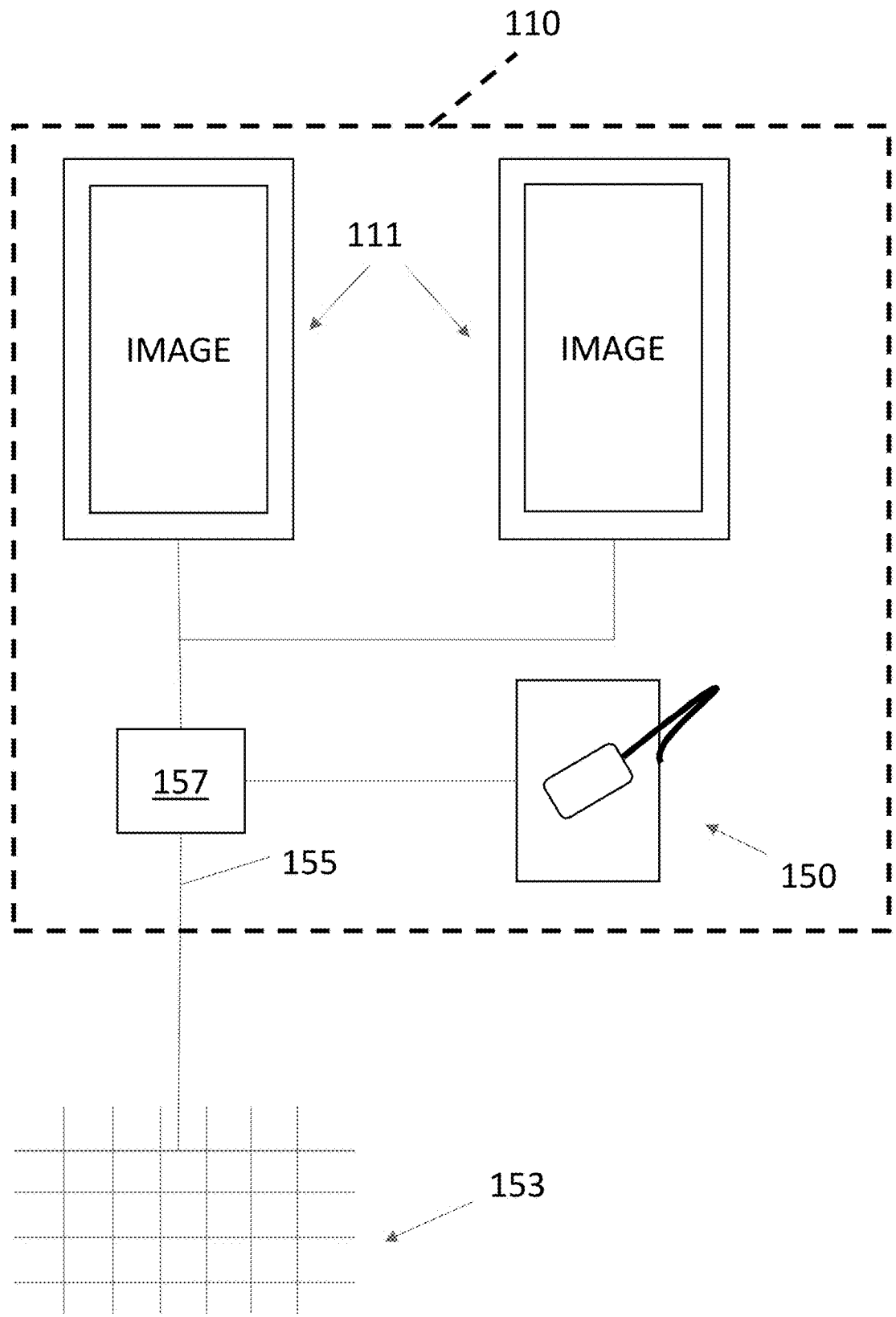
FIG. 15C is a plan view of another exemplary electrical schematic for the display assembly of FIGS. 1-14.
Figure 15D:
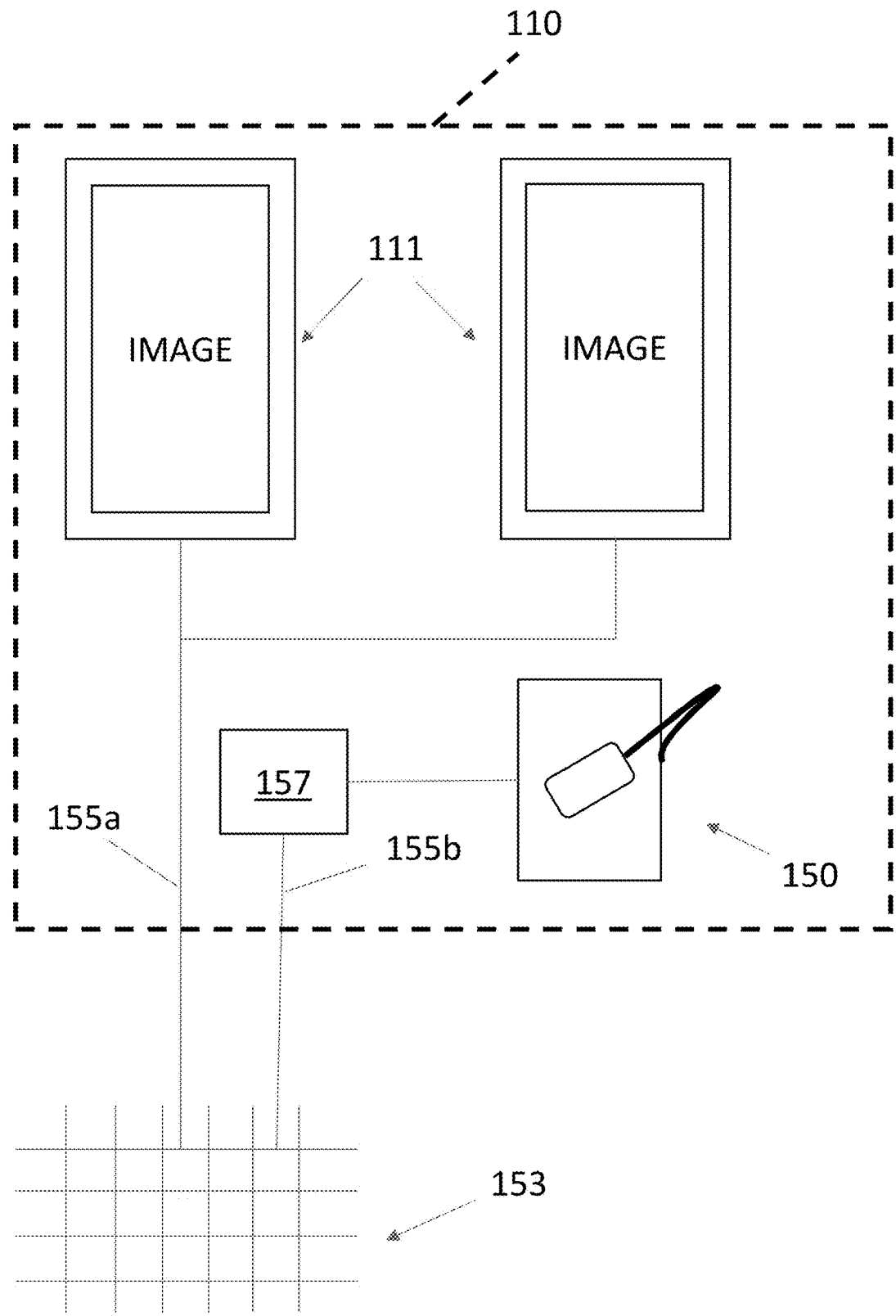
FIG. 15D is a plan view of another exemplary electrical schematic for the display assembly of FIGS. 1-14.

FIG. 15A through FIG. 15D illustrate various exemplary electrical schematics for the display assemblies 110. In exemplary embodiments, the side assemblies 111 and the EV charging equipment 150 may be connected to a common power supply 153, such as, but not limited to, the electrical grid, solar panels, wind turbines, power generators, combinations thereof, or the like. Such electronic connection to the power supply 153 may be made by way of a common connection point or line 155, such as shown with particular regard to FIGS. 15A-15C, or separate connection points or lines 155a, 155b, to the same or different power supplies 153, such as shown with particular regard to FIG. 15D. The EV charging equipment 150 may comprise any number of EV electric vehicle connector portions for any number or type of electric vehicles.

Optionally, one or more bulk energy storage devices 157, such as, but not limited to, one or more batteries, may be utilized with the display assemblies 110. The bulk energy storage devices 157 may be part of the EV charging equipment 150 or separate therefrom. In exemplary embodiments, the bulk energy storage devices 157 are electrically interposed between an electric vehicle connector portion of the EV charging equipment 150 and the power supply 153, though such is not required. In other exemplary embodiments, such as shown with particular regard to FIG. 15C, the bulk energy storage devices 157 may be electrically interposed between the electric vehicle connector portions of the EV charging equipment 150 and the side assemblies 111. The bulk energy storage devices 157 may act as the power supply 153 and/or a supplementary and/or alternative power supply 153 in exemplary embodiments.

One example of such EV charging equipment 150 includes, for example without limitation, electric vehicle chargers and related equipment provided available from ChargePoint, Inc. of Campbell, California (https://www.chargepoint.com/). Another example of such EV charging equipment 150 includes, for example without limitation, electric vehicle chargers and related equipment available from by EV-Box North America Inc. of Libertyville, Illinois (https://evbox.com/us-en/).

In exemplary embodiments, without limitation, the housing 151 may be fully or partially enclosed in a manner which fully or partially seals an interior space of the housing 151 from ambient air. For example, without limitation, the housing 151 may comprise one or more enclosures conforming to one or more environmental protection ratings, such as but not limited to, National Electrical Manufacturer Association (NEMA) 1, 2, 3, 3R, 3X, 3RX, 3S, 3SX, 4, 4X, 5, 6, 6P, 12, 12K and/or 13.

The housing 151 may extend entirely or partially within the frame 114. The housing 151 may extend entirely or partially outside of the frame 114. The housing 151 may be connected, directly or indirectly, to the frame 115. The housing 151 may be provided as, as part of, or within, the additional equipment cavity 152 in exemplary embodiments.

In exemplary embodiments, without limitation, some or all of the EV charging equipment 150 may be provided within the housing 151. However, one or more electrical power supply lines may extend through the housing 151 and/or the frame 114 to connect with other electrical power supply lines for the subassemblies 111 and/or other components of the display assemblies 110, such as to provide the common connection line or point 155 to the power supply or supplies 153, though such is not required.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing devices. The electronic devices may comprise personal computers, smartphones, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A display assembly with improved airflow, said display assembly comprising:
   a frame;
   a side assembly connected to said frame and comprising an electronic display subassembly comprising a cover, a display layer located rearward of the cover, and an interior channel located rearward of the display layer and forward of a rear surface of the electronic display subassembly, a space behind the rear surface of the electronic display subassembly defining, at least in part, a rear compartment, and a space between over and the di play layer defining, at least in part, a front gap;
   an intake provided at an upper portion of the display assembly;
   an exhaust provided at a lower portion of the side assembly;
   an open airflow pathway connected to an ambient environment, said opening airflow pathway including the intake, the interior channel, and the exhaust;
   a closed airflow pathway fluidly separated from the ambient environment and the open airflow pathway, said closed airflow pathway including the front gap and the rear compartment; and
   a first set of fans provided at, and spaced apart along, the rear surface of the electronic display subassembly, and thereby within the rear compartment, wherein the first set of fans comprise shroud-less, centrifugal type fans, and wherein the first set of fans, when activated, move circulating gas within the closed airflow pathway; and
   a second set of fans provided at, and spaced apart along, the exhaust, and thereby adjacent to the interior channel, for moving ambient air within the open airflow pathway, when activated, wherein the second set of fans comprise shroud-less, centrifugal type fans.

2. The display assembly of claim 1 wherein:
   the first set of fans are arranged at the rear surface such that an intake portion is oriented on an z-axis relative to a viewing face of the side assembly to ingest the circulating gas from the front gap and an exhaust portion is arranged to direct the circulating gas ingested by the first set of fans outward in an x-y plane relative to the viewing face of the side assembly into the rear compartment, when activated.

3. The display assembly of claim 1 wherein:
   the second set of fans are arranged at the exhaust such that an intake opening is oriented on the z-axis relative to a viewing face of the side assembly to ingest the ambient air from the interior channel and an exhaust portion is arranged to direct the ambient air ingested by the second set of fans outward in the x-y plane relative to the viewing face of each of the side assembly into the exhaust of the display assembly, when activated.

4. The display assembly of claim 1 further comprising:
   electronics for operating the electronic display subassemblies located within the rear compartment.

5. The display assembly of claim 4 wherein:
   the electronics comprise one or more of: a processor, an electronic storage device, a computing device, a network connectivity device, a computing device, a video player, and a power module.

6. The display assembly of claim 1 wherein:
   the display layer of the electronic display subassembly comprises liquid crystals;

the electronic display subassembly further comprises a
backlight; and
the interior channel extends along least a portion of a rear
portion of the backlight.

7. The display assembly of claim 1 wherein:
the closed airflow pathway is fluidly separated from the
ambient environment and the open airflow pathways in
accordance with at least ingress protection code IP65 or
more well sealed.

8. The display assembly of claim 1 wherein:
the frame is configured for mounting to a ground surface.

9. The display assembly of claim 1 wherein:
the frame is configured for mounting to a structure.

10. The display assembly of claim 1 wherein:
the cover is attached to the frame.

11. The display assembly of claim 1 further comprising:
dividers extending between each of the first set of fans.

12. The display assembly of claim 11 further comprising:
airflow deflection elements at distal ends of the dividers.

13. The display assembly of claim 1 further comprising:
a shroud provided about at least some of the exhaust to
fluidly separate the exhaust from the rear compartment.

14. The display assembly of claim 1 further comprising:
a shroud provided about at least some of the intake to
fluidly separate the intake from the rear compartment.

15. The display assembly of claim 1 further comprising:
a channel extending lengthwise along a longitudinal axis
of the rear surface of the electronic display subassembly at a first side thereof to connect the rear compartment to the front gap, wherein the first set of fans are
located at a second side of the rear surface of the
electronic display subassembly; and
corrugation located within the interior channel.

16. The display assembly of claim 1 wherein:
the cover comprises multiple layers, including at least one
polarizer.

17. The display assembly of claim 1 further comprising:
a rear cover located behind the electronic display subassembly, wherein the rear compartment is further
defined, at least in part, by the rear cover.

18. A display assembly with improved airflow, said display assembly comprising:
a frame configured for mounting to a ground surface or a
structure;
a side assembly connected to said frame and comprising:
  a cover;
  a display layer comprising liquid crystals located rearward of the cover;
  a rear surface;
  a backlight located rearward of the display layer;
  a rear surface located rearward of the backlight; and
  a channel extending longitudinally along the rear surface at a first side thereof;
an interior channel defined, at least in part, by the backlight and the rear surface such that the interior channel
extends, in part, along a rear portion of the backlight;
a rear compartment defined, at least in part, by the rear
surface;
a front gap defined, at least in part, by a space between the
cover and the display layer;
an intake provided at an upper portion of the side assembly;
an exhaust provided at a lower portion of the side assembly;
an open airflow pathway connected to an ambient environment and including the intake, the interior channel,
and the exhaust;
a closed airflow pathway fluidly separated from the ambient environment and the open airflow pathway, said
closed airflow pathway including the front gap and the
rear compartment;
a first set of fans provided at, and spaced apart along, a
second side of the rear surface, and thereby within the
rear compartment, wherein the first set of fans comprise
shroud-less, centrifugal type fans, and wherein the first
set of fans, when activated, move circulating gas within
the closed airflow pathway;
a second set of fans provided at, and spaced apart along,
the exhaust for moving ambient air within the open
airflow pathway, when activated, wherein the second
set of fans comprise shroud-less, centrifugal type fans;
and
electronics for operating the electronic display subassemblies located within the rear compartment, including at
the rear surface, said electronics comprising one or
more of: a processor, an electronic storage device, a
computing device, a network connectivity device, a
computing device, a video player, and a power module;
wherein the first set of fans are arranged at the rear surface
such that an intake portion is oriented on a z-axis
relative to a viewing face of the side assembly to ingest
the circulating gas from the front gap and an exhaust
portion is arranged to direct the circulating gas ingested
into the first set of fans outward in an x-y plane relative
to the viewing face of the side assembly within the rear
compartment, when activated;
wherein the second set of fans are arranged at the exhaust
such that an intake portion is oriented on the z-axis
relative to the viewing face of the side assembly to
ingest the ambient air from the interior channel and an
exhaust portion is arranged to direct the ambient air
ingested to the second set of fans outward in the x-y
plane relative to the viewing face of the side assembly,
when activated; and
wherein the closed airflow pathway is fluidly separated
from the ambient environment and the open airflow
pathway in accordance with at least ingress protection
code IP65 or more well sealed.

19. A display assembly with improved airflow, said display assembly comprising:
a frame configured for mounting to a ground surface or a
structure;
a side assembly connected to said frame and comprising:
  a cover;
  a display layer comprising liquid crystals located rearward of the cover;
  a rear surface;
  a backlight located rearward of the display layer;
  a rear surface located rearward of the backlight; and
  a channel extending longitudinally along the rear surface at a first side thereof;
an interior channel defined, at least in part, by the backlight and the rear surface such that the interior channel
extends, in part, along a rear portion of the backlight;
a rear cover located rearward of the rear surface;
a rear compartment defined, at least in part, by the rear
surface and the rear cover;
a front gap defined, at least in part, by a space between the
cover and the display layer;
an intake provided at an upper portion of the side assembly;
an exhaust provided at a lower portion of the side assembly;

an open airflow pathway connected to an ambient environment and including the intake, the interior channel, and the exhaust;

a closed airflow pathway fluidly separated from the ambient environment and the open airflow pathway, said closed airflow pathway including the front gap and the rear compartment;

a first set of fans provided at, and spaced apart along, a second side of the rear surface, and thereby within the rear compartment, wherein the first set of fans comprise shroud-less, centrifugal type fans, and wherein the first set of fans, when activated, move circulating gas within the closed airflow pathway;

a second set of fans provided at, and spaced apart along, the exhaust for moving ambient air within the open airflow pathway, when activated, wherein the second set of fans comprise shroud-less, centrifugal type fans; and electronics for operating the electronic display subassemblies located within the rear compartment, including at the rear surface, said electronics comprising one or more of: a processor, an electronic storage device, a computing device, a network connectivity device, a computing device, a video player, and a power module;

wherein the first set of fans are arranged at the rear surface such that an intake portion is oriented on a z-axis relative to a viewing face of the side assembly to ingest the circulating gas from the front gap and an exhaust portion is arranged to direct the circulating gas ingested into the first set of fans outward in an x-y plane relative to the viewing face of the side assembly within the rear compartment, when activated;

wherein the second set of fans are arranged at the exhaust such that an intake portion is oriented on the z-axis relative to the viewing face of the side assembly to ingest the ambient air from the interior channel and an exhaust portion is arranged to direct the ambient air ingested to the second set of fans outward in the x-y plane relative to the viewing face of the side assembly, when activated; and wherein the closed airflow pathway is fluidly separated from the ambient environment and the open airflow pathway in accordance with at least ingress protection code IP65 or more well sealed.

20. The display assembly of claim 19 further comprising:

a shroud provided about at least some of the exhaust to fluidly separate the exhaust from the closed loop airflow pathway;

a shroud provided about at least some of the intake to fluidly separate the intake from the closed loop airflow pathway;

dividers extending between each of the first set of fans; and airflow deflection elements at distal ends of the dividers.

* * * * *

UNITED STATES PATENT AND TRADEMARK OFFICE
CERTIFICATE OF CORRECTION

PATENT NO. : 12,459,383 B2  
APPLICATION NO. : 18/961628  
DATED : November 4, 2025  
INVENTOR(S) : William Dunn et al.

Page 1 of 1

It is certified that error appears in the above-identified patent and that said Letters Patent is hereby corrected as shown below:

On the Title Page

In Item (56), References Cited, U.S. Patent Documents, please delete "7,212,403 B2 5/2007 Rockenfell" and insert -- 7,212,403 B2 5/2007 Rockenfeller --.

In Item (56), References Cited, U.S. Patent Documents, please delete "2006/0012985 A1 1/2006 Archie et al." and insert -- 2006/0012985 A1 1/2006 Archie, Jr. et al. --.

In Item (56), References Cited, U.S. Patent Documents, please delete "2006/0060732 A1 3/2006 Tannas" and insert -- 2006/0060732 A1 3/2006 Tannas, Jr. --.

In Item (56), References Cited, U.S. Patent Documents, please delete "2006/0221270 A1 10/2006 Toki et al." and insert -- 2006/0221270 A1 10/2006 Ioki et al. --.

In Item (56), References Cited, U.S. Patent Documents, please delete "2007/0267554 A1 11/2007 Tannas" and insert -- 2007/0267554 A1 11/2007 Tannas, Jr. --.

In the Claims

In Column 12, Line 15, Claim 1, please delete "over" and insert -- the cover --.

In Column 12, Line 16, Claim 1, please delete "di play" and insert -- display --.

In Column 12, Line 55, Claim 3, please delete "each of".

In Column 13, Line 3, Claim 6, please delete "along least" and insert -- along at least --.

Signed and Sealed this  
Sixteenth Day of December, 2025

John A. Squires  
*Director of the United States Patent and Trademark Office*